United States Patent [19]

Alapat

[11] Patent Number: 5,357,471

[45] Date of Patent: Oct. 18, 1994

[54] FAULT LOCATOR ARCHITECTURE AND METHOD FOR MEMORIES

[75] Inventor: Varkey P. Alapat, Sunnyvale, Calif.

[73] Assignee: National Semiconductor Corporation, Santa Clara, Calif.

[21] Appl. No.: 856,004

[22] Filed: Mar. 20, 1992

[51] Int. Cl.$^5$ ............................................ G11C 11/40
[52] U.S. Cl. ...................................... 365/201; 365/96; 365/210; 371/15.1
[58] Field of Search .................. 371/21.1, 21.4, 51.1, 371/15.1; 365/200, 201, 210, 96

[56] References Cited

U.S. PATENT DOCUMENTS

| | | | |
|---|---|---|---|
| 3,270,318 | 8/1966 | Strawbridge | 371/51.2 |
| 4,320,507 | 3/1982 | Fukushima et al. | 371/21.4 |
| 4,393,475 | 7/1983 | Kitagawa et al. | 365/201 |
| 4,429,388 | 1/1984 | Fukushima et al. | 365/201 |
| 4,833,652 | 5/1989 | Isobe et al. | 365/200 |
| 4,862,418 | 8/1989 | Cuppens et al. | 371/21.1 |
| 4,903,265 | 2/1990 | Shannon et al. | 371/21.4 |
| 4,970,727 | 11/1990 | Miyawaki et al. | 371/21.4 |
| 5,007,026 | 4/1991 | Gaultier et al. | 365/201 |
| 5,060,230 | 10/1991 | Arimoto et al. | 365/201 |
| 5,214,604 | 5/1993 | Kato | 365/201 |

OTHER PUBLICATIONS

Pawlowdki, et al., "Functional Testing of EPROMs", *IEEE Journal of Solid-State Circuits*, vol. SC-19, No. 2, Apr. 1984.
Kondo, "Test Patterns for EPROMs," *IEEE Journal of Solid-State Circuits*, vol. SC-14, No. 4, Aug. 1979.
Kondo, et al., "An Erase Model in Double Poly-Si Gate n-Channel FAMOS Devices," *IEEE Transactions on Electron Devices*, vol. ED 25, No. 3, Mar. 1978.
Yu, "Bitmapping A Tool for EPROM Failure Analysis," IPFA Symposium Proceeds, 1987.
Morandi, et al., "On the Use of Matrix Algebra for the Description of EPROM Failures," *IEEE Journal of Solid-State Circuits*, vol. SC-16, No. 2, Apr., 1981.
Suk, et al., "A March Test for Functional Faults in Semiconductor Ramdom Access Memories", *IEEE Transactions on Computers*, vol. C-30, No. 12, Dec., 1981.
Fuchs, et al., "A Unified Approach to Concurrent Error Detection in Highly Structured Logic Arrays", 16th FTCS, Kissemmee, USA, 1984.
Sridhar, "A New Parallel Test Approach for Large Memories," 1985 International Test Conference.
Marinescu, "Simple and Efficient Algorithms for Functional RAM Testing," 1985 Test Conference.
Cocking, "RAM Test Patterns and Test Strategy," Fairchild System Technology, pp. 1–7.
Mak, et al., "The Design of PlAs with Concurrent Error Detection," Coordinated Science Laboratory, Univ. of IL. 1982.
Barnes, et al., "Operation and Characterization of N–Channel EPROM Cells," *IEEE Journal of Solid-State Electronics*, vol. 21, pp. 521–529, 1978.

*Primary Examiner*—Eugene R. LaRoche
*Assistant Examiner*—F. Niranjan
*Attorney, Agent, or Firm*—Townsend and Townsend

[57] ABSTRACT

Architecture for a memory device and a method for employing the architecture for testing of the memory device are provided. In a memory device such as a one-time programmable EPROM, an extra row and an extra column of memory cells are added to the regular array. The extra column is configured so that, during a first test configuration, a sense device connected to the column line of the extra column of cells will detect whether exactly one row line of the correct parity is selected in response to input of a row address. Similarly, the extra row is configured so that the sense amp connected to the column lines of the regular array, can determine whether exactly one column line of the correct parity from the regular array is selected in response to input of a column address. The row decoder and row address lines are tested separately from the testing of the column decoder and column address lines. In this fashion, an EPROM can be tested to obtain single fault coverage for faults in address logic (including address inputs) and certain faults in a memory array without the need to write or program a memory cell. This permits practical testing for the above-mentioned coverage for EPROMs which cannot feasibly be erased such as one-time programmable (OTP) EPROMs.

24 Claims, 16 Drawing Sheets

FAULT LOCATOR ARCHITECTURE AND METHOD FOR MEMORIES

BACKGROUND OF THE INVENTION

The present invention relates to an architecture and method for locating faults in a memory device. One embodiment of the invention relates to an apparatus and method for testing EPROM-based One Time Programmable (OTP) memories to locate hardware faults in the address input lines, the row or column decoders or certain faults in the memory cell array.

In the manufacture of memory devices, it is typically desired to test the memory devices for faults before delivering or selling the memory devices. One type of memory which is typically tested is read only memory. This is a memory which is designed so that, in normal use, its contents can be read but cannot be written to or changed. A programmable read only memory (PROM) is a memory which can be written to once, i.e., in which it is possible to electronically change the state of a given memory cell (i.e., the unit of memory which is in either a first or second state, storing a "1" or a "0") from its erased state to the opposite state but in which an erasing of the programmed memory cell is not done during normal operation. The writing of data to a cell of the PROM is called "programming". Typically, a PROM cell is programmed using voltages higher than those used in addressing and reading a cell.

One class of PROMs permits erasing of programmed cells but requires special procedures for erasing and thus does not permit erasing during normal, routine use of the memory. These memories are referred to as an erasable programmable read only memories (EPROM). In some types of EPROMs, data programmed or stored in the memory can be erased by exposing the cells to light, typically ultraviolet light. These memories are manufactured in a package which includes a window, typically a quartz window to permit transmission of ultraviolet light. Windowed EPROMs are particularly useful during software development because the memory can be reprogrammed to correct programming errors and the like. One difficulty with windowed EPROMs is the relatively high cost of producing the windowed packages. So it is economically advantageous to substitute windowed EPROMs with windowless EPROMs in products, after the software development phase is completed. These are sometimes referred to as one-time programmable (OTP) EPROMs. This term is something of a misnomer since, being windowless, the memory, once packaged, is not erasable.

OTP EPROMs, while valuable for the reasons discussed above, present certain difficulties in testing the parts after manufacture. This can be best understood by describing how testing of normal or "windowed" EPROMs is conducted. Although a number of testing methodologies for windowed EPROMs are available, the testing used according to previous schemes has involved writing data to at least some of the memory cells in the normally-used array, as described, for example, in M. Pawlowski, et al "Functional Testing of EPROM's", *IEEE Journal of Solid-State Circuits*, Vol. SC-19, No. 2, April, 1984, pps. 212–218. This presents no particular difficulty in the context of windowed EPROMs since, following such a programming of cells in the array, the EPROM can be erased to permit the desired final program to be placed into the memory array. Even with windowed EPROMs, this procedure has the undesirable characteristic that erasing the arrays can be undesirably time-consuming.

This type of testing is infeasible using cells in the memory array used in normal operation of a packaged OTP device, since these cells if programmed for a testing purpose cannot be thereafter erased to permit insertion of the desired program into memory. Varying degrees of testing capability for OTP EPROMs could be achieved providing additional memory cells (i.e. in addition to those which are accessed during normal use of the device). For example, in many commercially available OTP EPROMs, a certain number of additional cells are provided, in addition to the normal array, exclusively for the purpose of testing certain functions. However, this approach has the disadvantage that it increases the silicon area requirement. Furthermore, this type of testing is non-repeatable with a same set of test cells, if test procedures involve programming the test cells each time, since they cannot be erased in a packaged OTP EPROM. Designs permitting single fault coverage in packaged OTP EPROMs for faults in addressing logic, including address inputs, in repeatable manner, (with tests involving a write to memory cells, at least a first time), if at all possible, will consume silicon area, adversely affecting the economic feasibility of the commercial product. Economic implementation of repeatable tests would be advantageous in the production environment, customer testing, testing of customer-returned parts, and testing at different stages (for example, after dynamic burn-in).

Accordingly, it would be useful to provide an OTP EPROM which can be tested so as to detect different types of address line and decoder faults as well as most of the memory cell array faults not involving charge storage. It would also be useful to provide an OTP EPROM in which this fault testing can be repeatable.

SUMMARY OF THE INVENTION

The present invention provides an architecture for an OTP EPROM and a methodology for using that architecture to conduct repeatable fault tests which do not require programming or writing to a cell as part of the testing procedure. Because these tests are repeatable without writing to a cell, faults which could be uncovered by this test, can be detected without writing to a cell.

According to one embodiment of the invention, the new memory device architecture includes a plurality of memory cells, in addition to the memory cells used during normal operation of the memory device. These plurality of additional cells which are in the unprogrammed state will be used for testing for faults in the address inputs, address decoders, and for certain types of faults in the memory array, without the necessity to program any cell, hence providing tests which will provide single fault coverage for these faults, which are repeatable without erasure. In one embodiment, each of these additional cells is connected to either one of a plurality of row lines, or one of a plurality of column lines. Preferably, the test is conducted in two phases: Row Address Test Phase, during which rows are individually selected changing the row address on the address input pins; and Column Address Test Phase, during which columns are individually selected changing the column address on the address input pins. If the decoders are working properly during the test phases (i.e. if the decoders respond properly), either a single row line will be selected or a single column line will be selected in response to receiving an address. A line is selected by placing a predetermined voltage on that line. Since no cell is programmed during both the above-described Row and Column Address Test Phases with this new architecture, during these test phases a selected row and selected column will have voltage levels enabling a read. The additional memory cells used for the testing purpose in this architecture, connected to either row or column lines, are grouped into an odd parity cell group and even parity cell group, based on the parity of the intended address of the row or column line to which each of these additional cells is connected. If the address inputs and address logic are responding properly during the test phases, when an address is input, the parity group of the additional cell to which the individually selected row or column line is connected, will match the parity of the row or column address applied on the input pins. This feature is used to check whether the parity of the address for which the selected row or column line in the array is configured, is the same as the parity of the row or column address on the input pins. To enable this comparison the parity of the row or column address is provided as an input, along with the column or row address input. The memory device is tested by determining whether a row line or a column line is individually selected (i.e., whether at least one, and no more than one row line or at least one, and no more than one column line has been selected), and the selected row or column line has the intended address parity for which it is configured. This determination is made without having to program the memory cells which are used for this testing purpose, as well as without having to program the memory array.

In one embodiment of the invention, the apparatus includes an M×N memory array having M rows and N columns of cells. For the sake of simplicity, the following description is in terms of a one-bit bank memory (i.e., in which a properly functioning memory provides access to one bit of the memory in response to a given row and column address). It is not uncommon to provide multi-bit bank memory, such as an eight-bit bank memory (i.e., in which a properly-functioning memory provides access to eight bits in response to a given row and column address). Four-bit bank memories, sixteen-bit bank memories and other sizes are also known. The present invention includes such multi-bit bank memories as well as one-bit bank memories and it will be readily apparent to those skilled in the art how the following discussion of one-bit bank memories applies to multi-bit bank memories. For example, references below to turning on "exactly one memory cell" will be understood, by those skilled in the art, to refer to turning on exactly one bit-cell in the case of a one-bit bank of memory and to refer to turning on exactly eight bit-cells in the case of an eight-bit bank of memory.

During normal operation of the array (i.e., non-testing operation) a row address and a column address are received on address pins. The address is decoded and a single row line and single column line are selected. For testing purposes, an additional column of memory cells, i.e., an (N+1)th column, and an additional row, i.e., an M+1)th row, are added to the M×N array. Each cell in the (N+1)th column is connected to one of the row lines. Each cell in the M+1)th row is connected to one of the column lines. A first sensing circuit can sense whether exactly one (i.e., at least one and no more than one) memory cell in the (N+1)th column is turned on. A second sensing circuit can sense whether exactly one of the cells in the (M+1)th row is turned on. In one embodiment, a memory cell is said to be in a turned on state, when its source is grounded, the column line to which its drain is connected is selected (connected to the sense amp) and the row is selected, making the cell conductive. So a cell in the turned-on state will provide a low resistance path between selected column line and ground, decreasing the sense voltage on the selected column line. A memory cell is said to be in a turned-off state, when its column line is not selected (connected to sense amp) and/or when its row is not selected and/or its source is not grounded. A cell in the turned-off state does not provide a low resistance path between ground and the column line selected (connected to sense amp).

The method of testing row decoder and row address input lines includes placing a row address on the row address pins and determining whether exactly one of the memory cells in the (N+1)th column belonging to the correct parity group has been turned on. The method of testing the column decoder or column address input lines includes placing a column address on the column address pins and determining whether exactly one of the memory cells in the (M+1)th row belonging to the correct parity group has been turned on. In one embodiment, a cell in the test column (N+1th column) is assigned to the odd parity group if the row line to which the gate of the cell is connected is intended to be selected by a row address which has odd parity (an "odd-addressed row line"). A cell in the test column is assigned to the even parity group if the row line to which the gate of the cell is connected is intended to be selected by an address which has even parity (an "even-addressed row line"). According to one embodiment, the apparatus is configured such that, during a test phase, if there is no fault, a cell in the (N+1)th column will be turned on only if the odd/even parity assigned to that cell matches the parity of the address which is placed on the row address input pins. Similarly, in one embodiment, a cell in the test row (M+1th row) is assigned to the odd parity group if the column line to which the drain of the cell is connected is intended to be selected by a column address which has an odd parity ("odd-addressed column line"). A cell in the test row is assigned to the even parity group if the column line to which the drain of the cell is connected is intended to be selected by an address which has even parity ("even-addressed column line"). According to one embodiment, the apparatus is configured such that, during a test phase, if there is no fault, a cell in the (M+1)th row will turn on only if the odd/even parity of that cell matches the parity of the column address placed on the column address input pins. Preferably, this test is conducted with a plurality of row addresses and with a plurality of column addresses to test whether each of the row lines can be properly selected and each of the column lines can be properly selected. Preferably, as done in the case of testing of previous OTP EPROMs, testing of the memory array may further include reading each cell in the memory array (by selecting the corresponding column and row addresses simultaneously) and determining whether the correct output data is received.

DETAILED DESCRIPTION OF THE PREFERRED EMBODIMENT

Figure 1A:
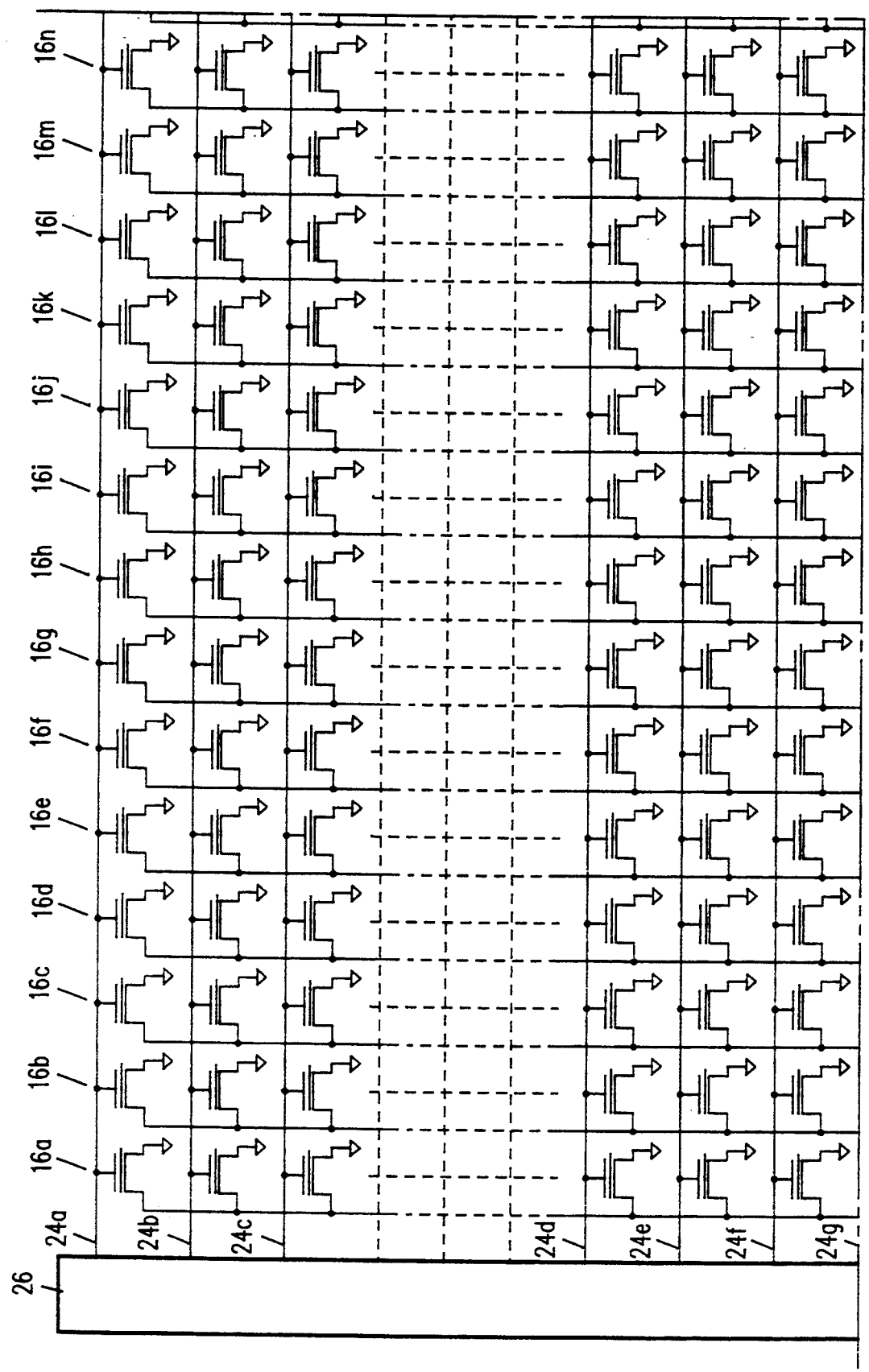
FIG. 1 is a schematic diagram showing an EPROM memory array and associated decoders and sense amps according to the prior art.
Figure 1B:
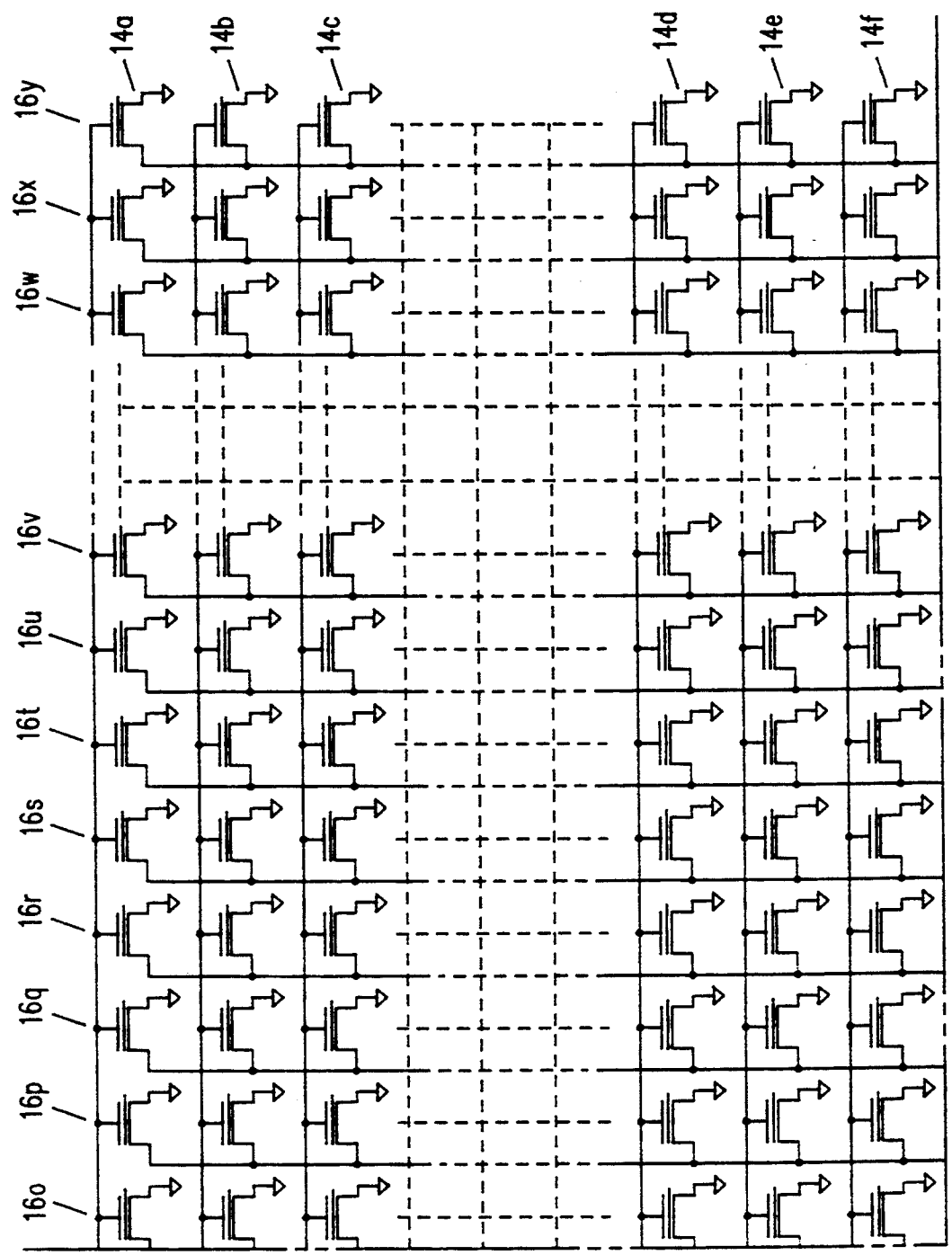
Figure 1C:
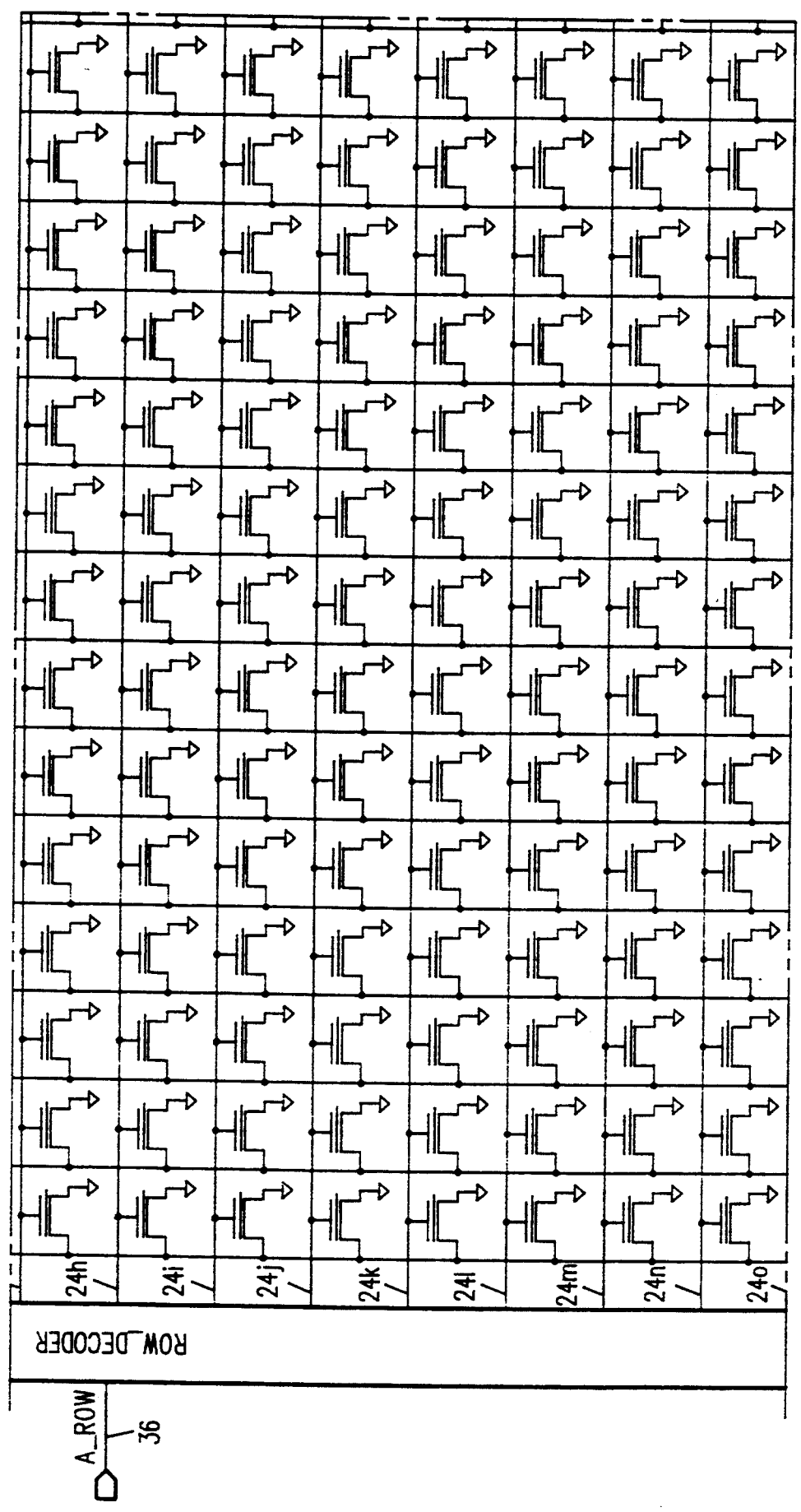
Figure 1D:
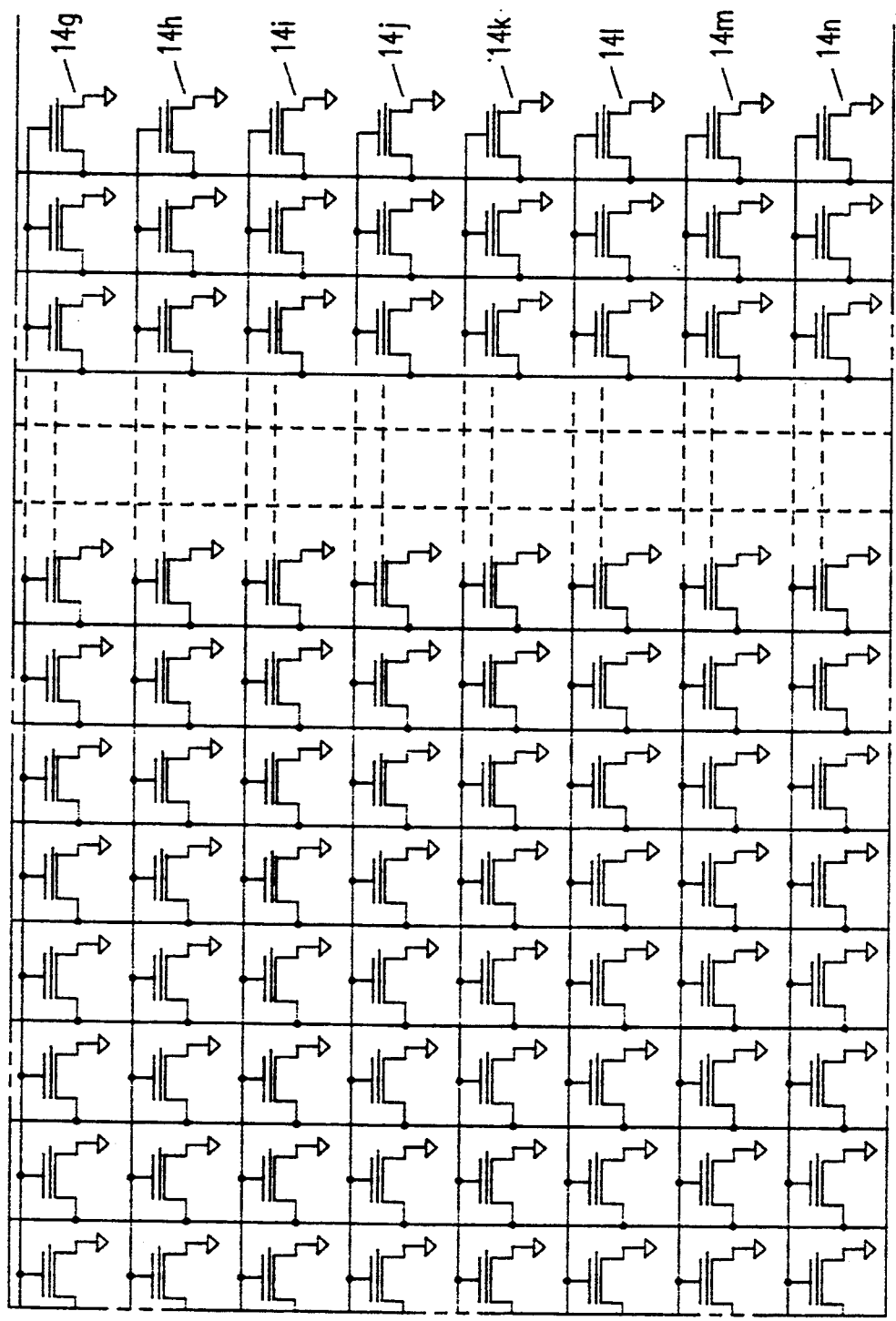
Figure 1E:
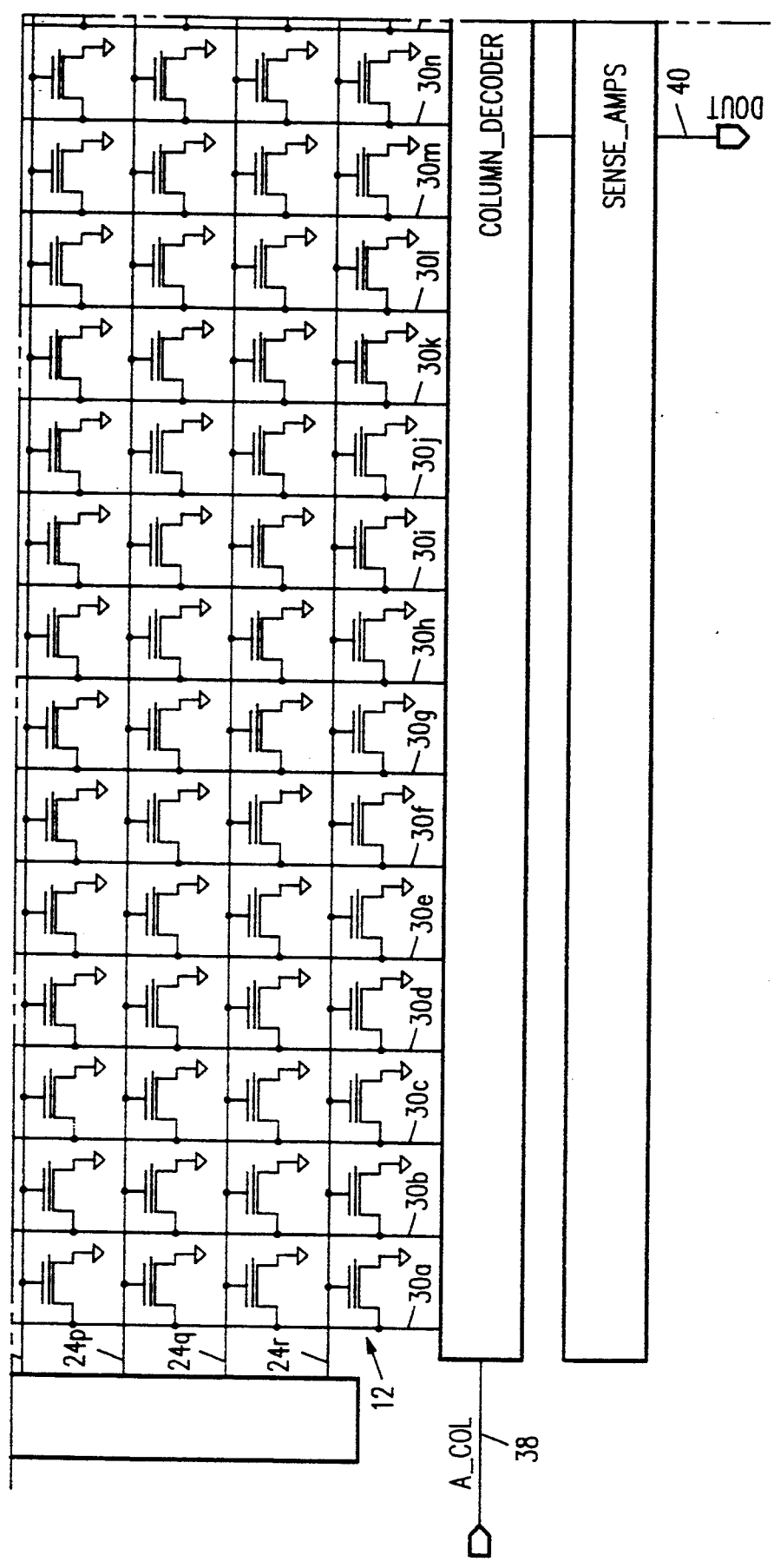
Figure 1F:
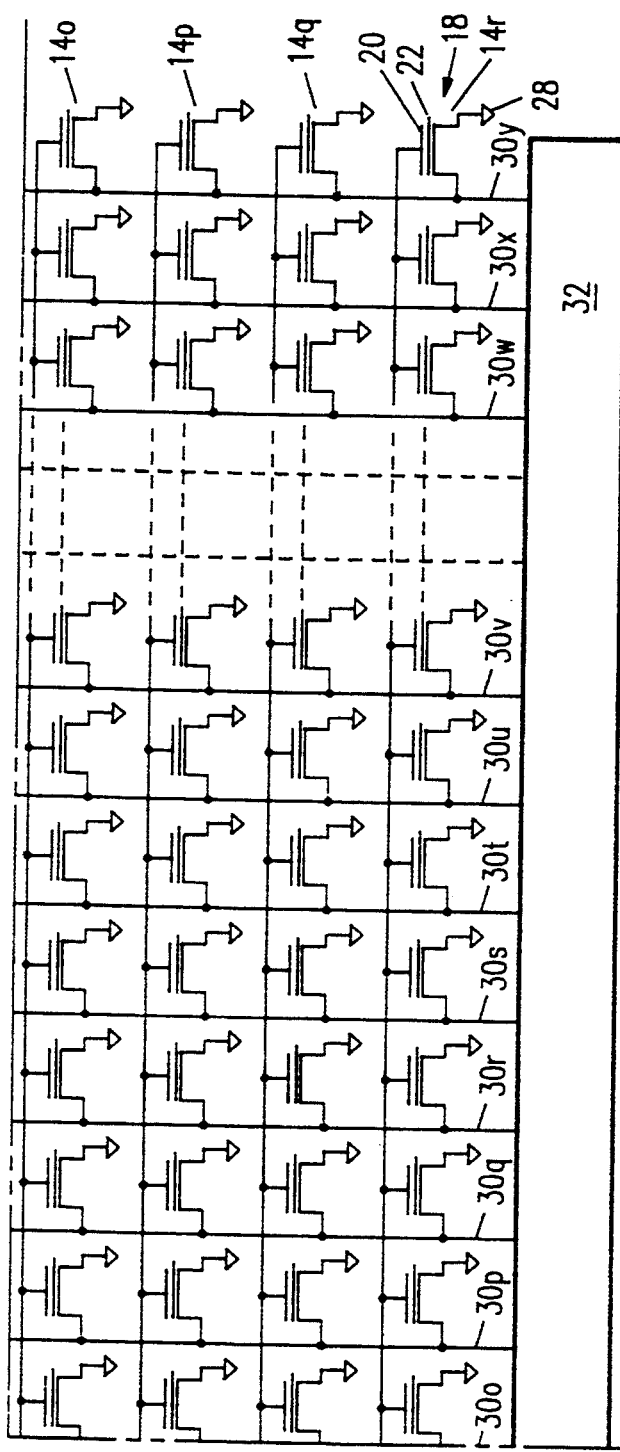
Figure 2A:
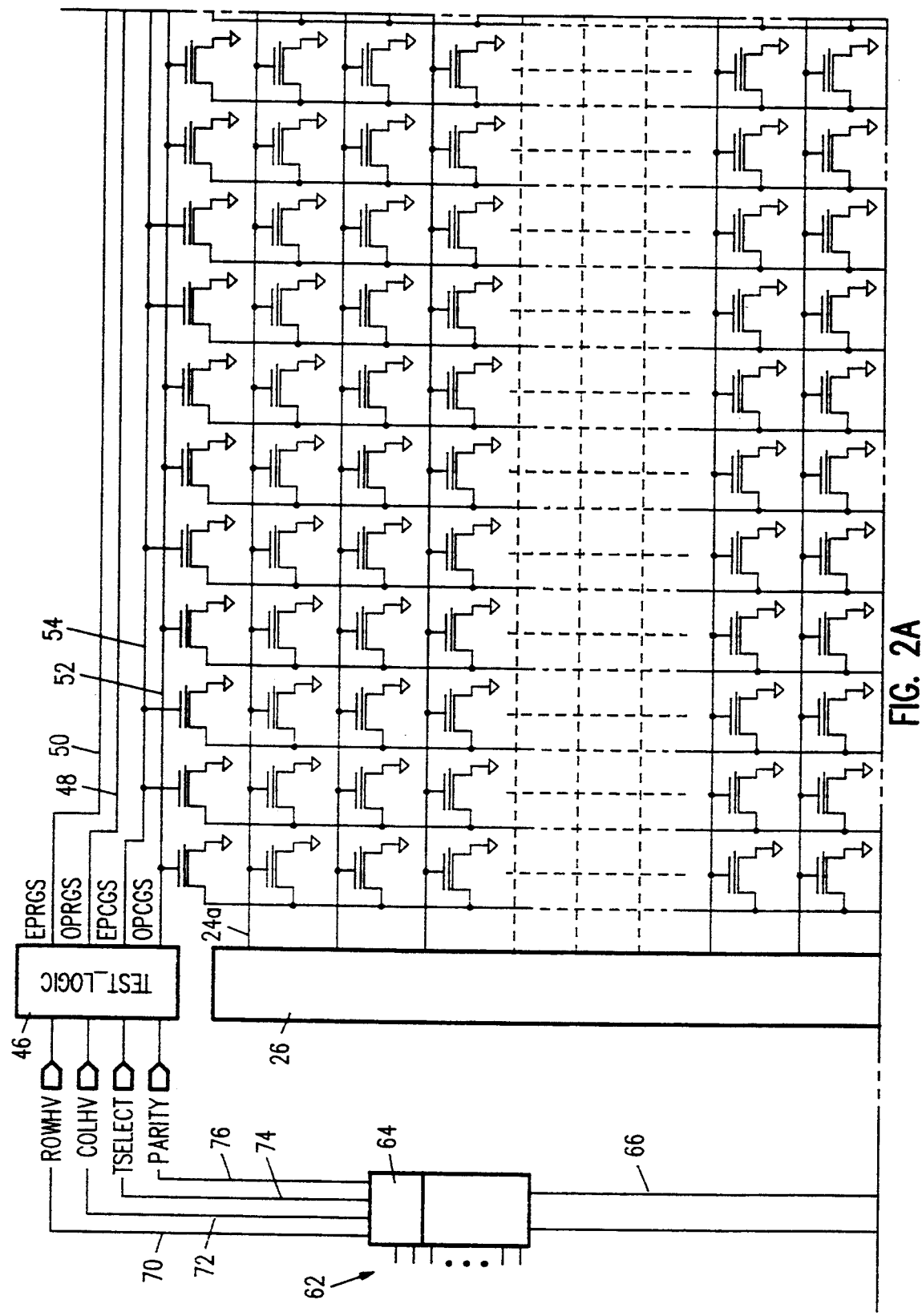
FIG. 2 depicts an EPROM memory array with test circuitry according to one embodiment of the present invention.
Figure 2B:
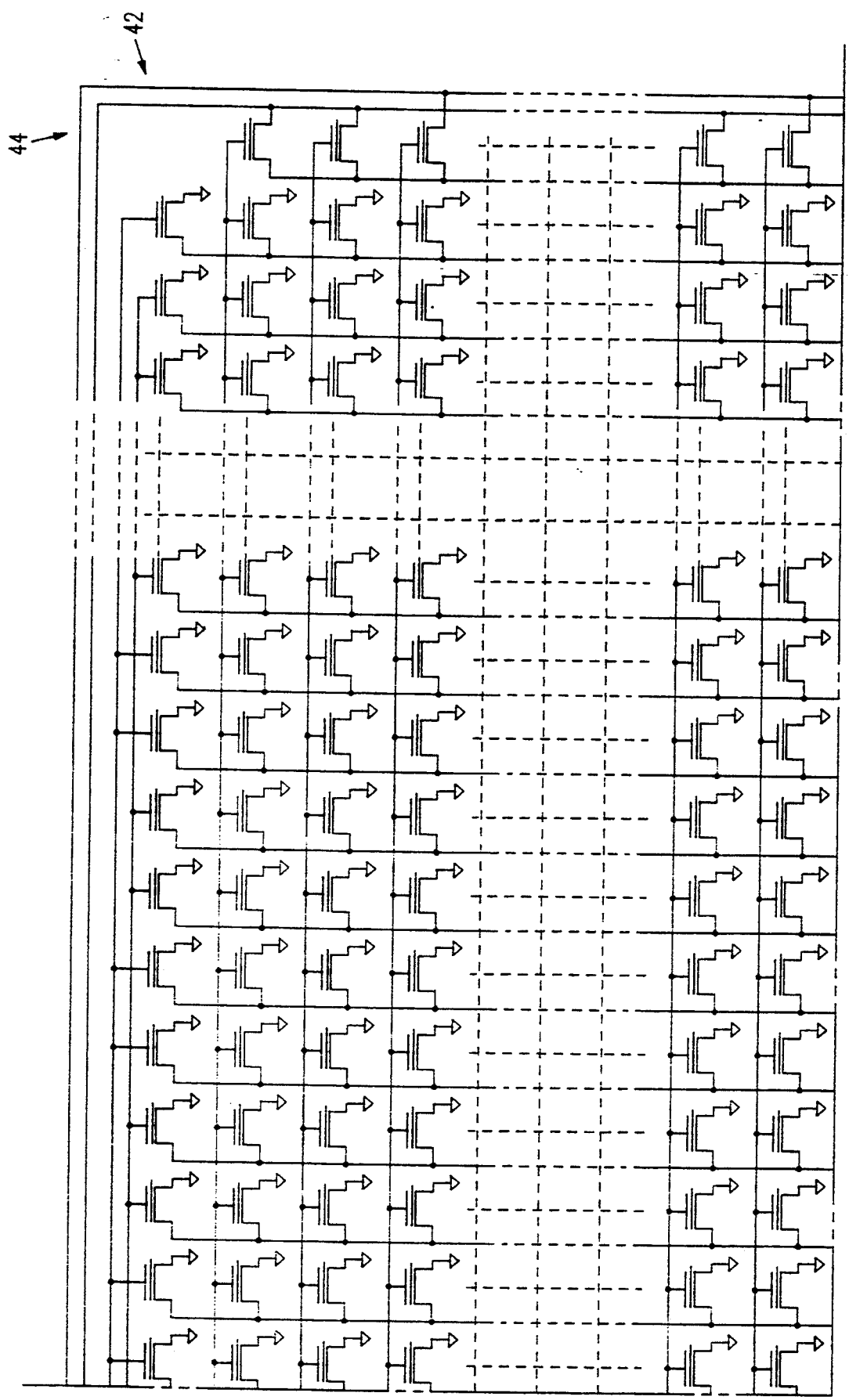
Figure 2C:
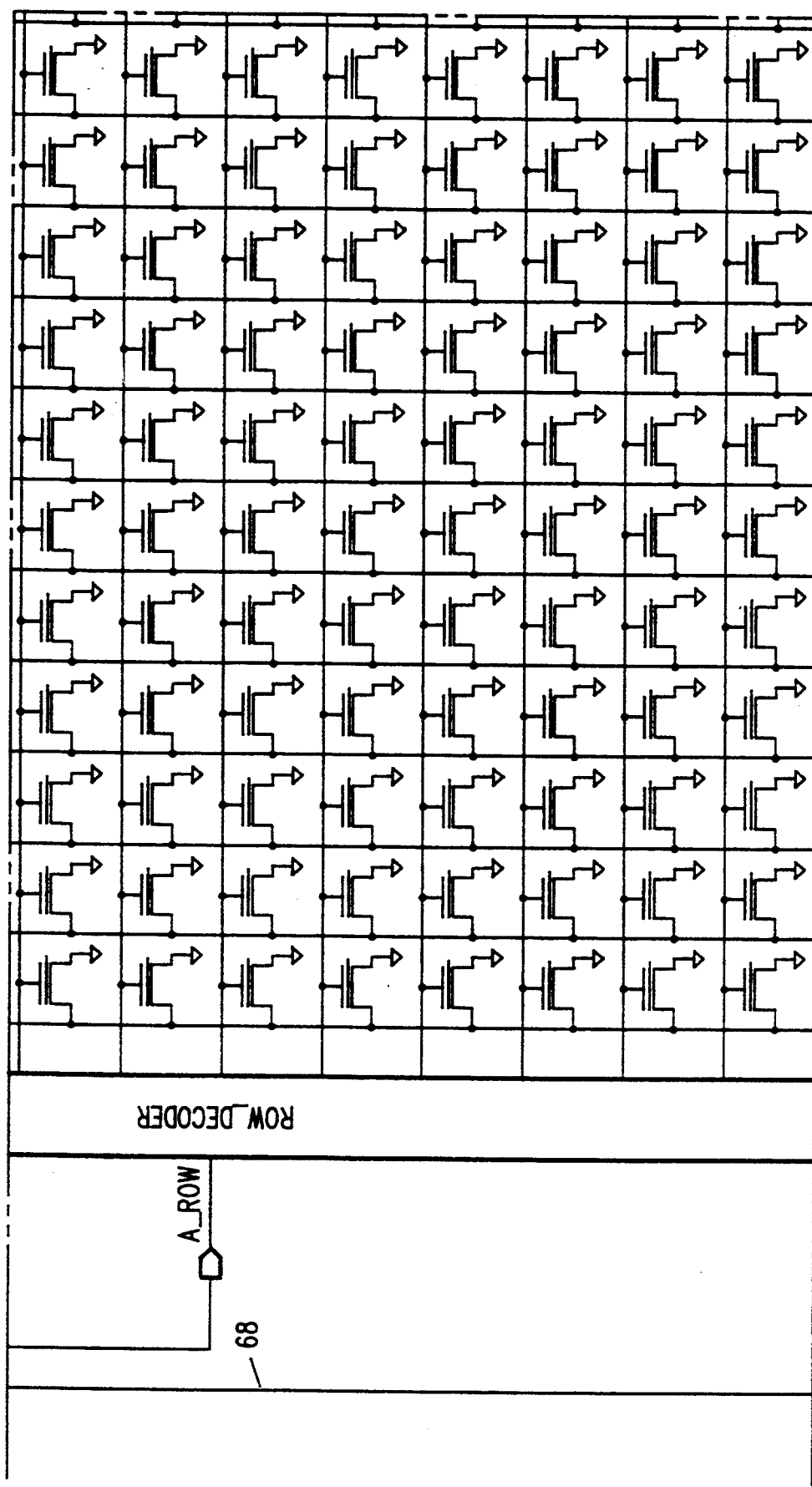
Figure 2D:
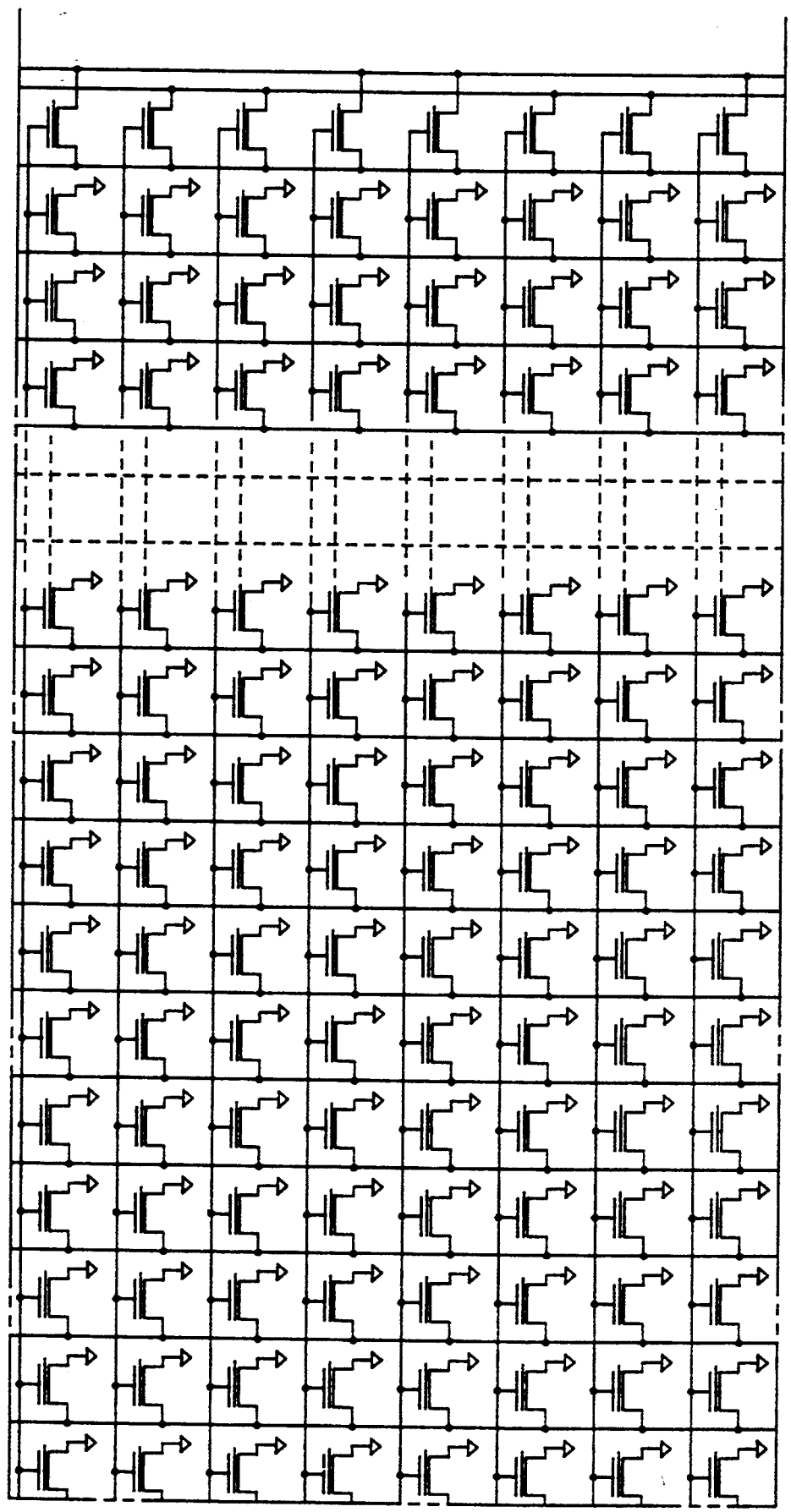
Figure 2E:
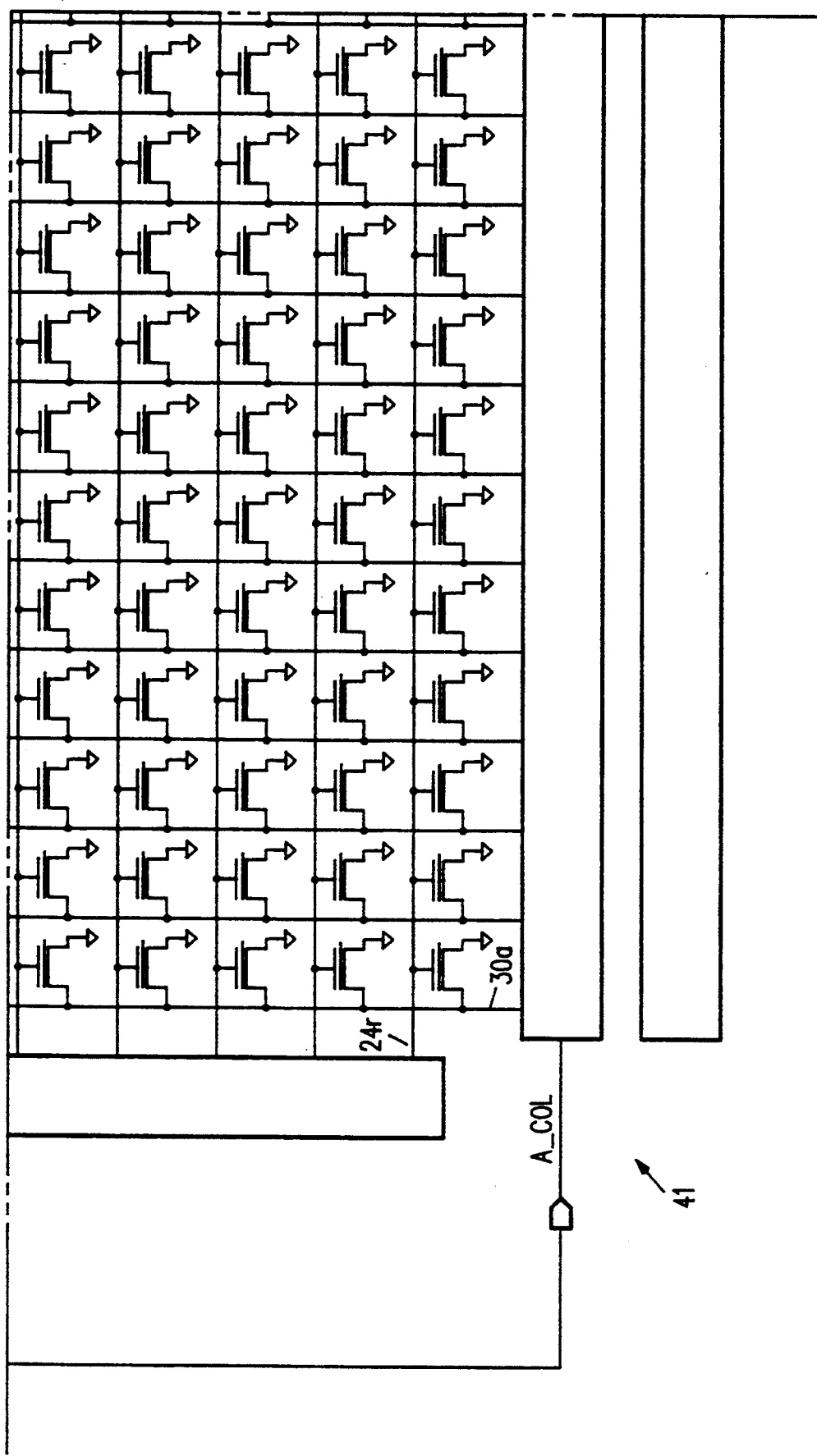
Figure 2F:
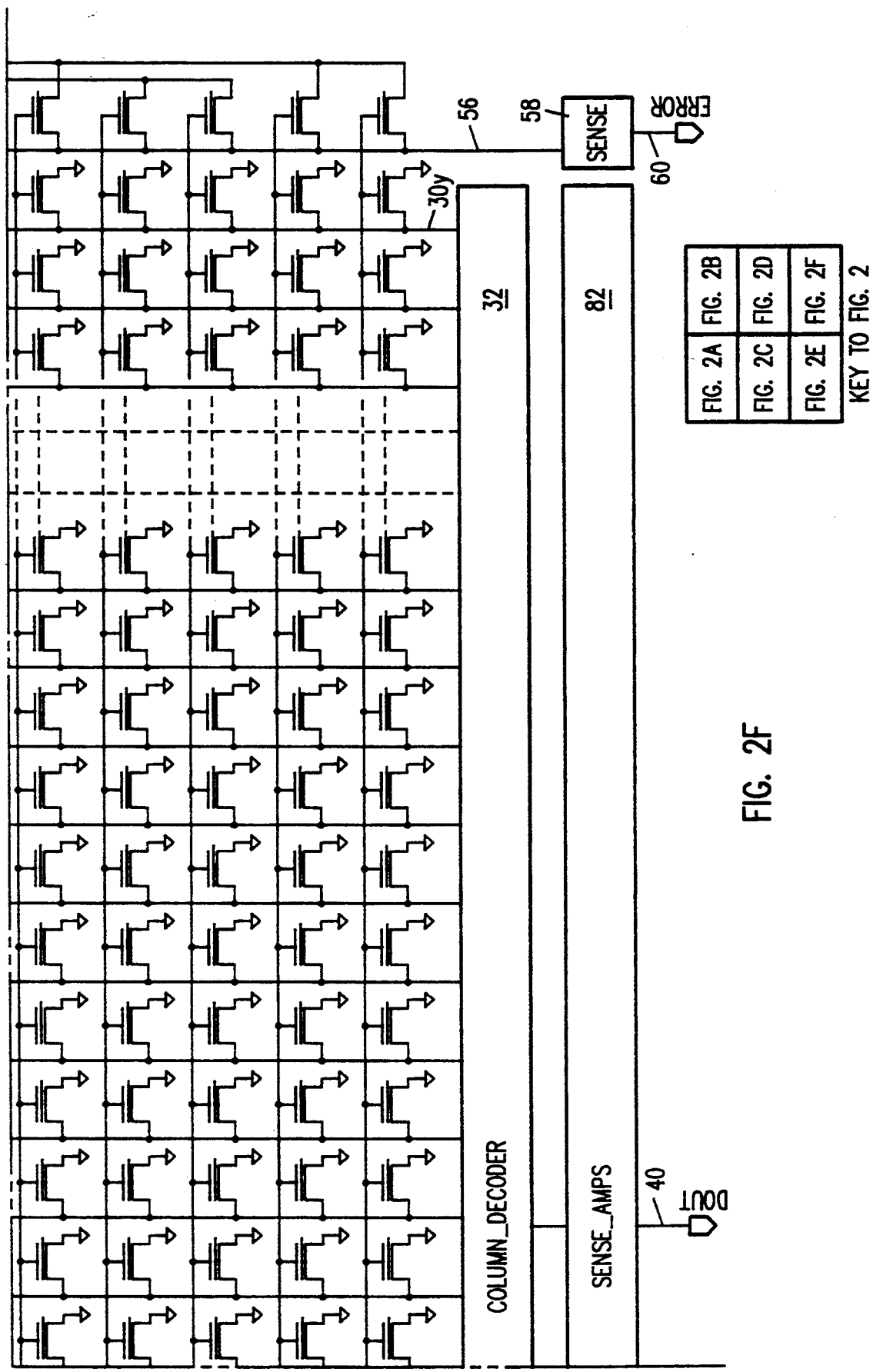

FIG. 1 depicts an EPROM memory array and associated decoders and sense amps according to previously provided devices. The memory device depicted in FIG. 1 includes a plurality of memory cells 12, each cell having a stacked-gate transistor 18. The memory cells 12 are arranged in a rectilinear "main array" having a number of rows 14a–14r and a number of columns 16a–16y. Of course, larger or smaller arrays can also be used. One of said stacked-gate transistors 18 includes a top select gate 20 and a bottom floating gate 22. The top gates 20 of all of the memory cells 12 in the particular row 14a–14r are connected to a single row line 24a–24r, each of which is controlled by a row decoder 26. Each stacked gate transistor 18 has a source and drain, source is connected to ground 28, and drain of which is connected to one of plurality of column lines 30a–30y. In the EPROM structure shown in FIG. 1, the drain of all the EPROM cells in a column, is connected to a column line, and the source of all the EPROM cells in the array, is tied to ground, although other EPROM array structures are possible as will be apparent to those skilled in the art. All of the transistors 18 in a given column 16a–16y are connected to a single column line 30a–30y, respectively, which are connected to a column decoder 32 and sense amps 34. The row decoder 26, column decoder 32 and sense amps 34 have configurations which are well-known, such as those described in *Principles of CMOS VLSI Designs: A System Perspective*, by Niel Weste and Kamran Eshraghian (1985).

Each cell 12 can be in a programmed state or unprogrammed state, depending on the state of the floating gate 22. The floating gate can be in either an unprogrammed state, in which the floating gate does not retain any substantial charge, and a programmed state, in which a charge is stored in the floating gate 22. A charge can be stored in the floating gate by injection of high energy electrons through an oxide layer surrounding the floating gate. Once the charge is injected, it will be stored in the floating gates since there are no electrical connections to this floating gate. The floating gate affects operation of the transistor 18 because the threshold of the transistor depends upon the charge on the floating gate. In one type of floating gate transistor, the presence of a charge on the floating gate results in a threshold which is higher than when there is no charge on the floating gate. Thus, when a cell 12 is in an unprogrammed state, the stacked gate transistor 18 of the cell has a relatively low threshold voltage so that a relatively low positive voltage placed on the select gate 20 will enable the unprogrammed cell 12 to be placed in a turned-on state. However, when the cell 12 has been programmed, its transistor 18 has a higher threshold voltage so that the same voltage which could make transistor 18 of an unprogrammed cell "on" is insufficient to make the transistor 18 of this programmed cell "on", leaving this programmed cell in a turned-off state.

During normal operation of the prior art EPROM, row addresses and column addresses which are received on pins of the EPROM package are placed respectively onto lines 36, 38 for transmission to the row decoder 26 and column decoder 32. The signals received on the package pins can be sent from any of a number of devices, depending upon the implementation. In one type of EPROM, signals will typically be received from address and data buses which are connected to a central processing unit, in a manner well-known in the art. In another embodiment, the EPROM is formed on the same chip with a microprocessor and signals are passed between the EPROM and the microprocessor via on-chip signal lines in a manner well-known in the art. Other uses and configurations of EPROMs are also possible, including the use of EPROM as a microcontroller's embedded memory.

The row decoder 26, when it is functioning properly, in response to an address 36 selects one of the row lines 24a–24r. A row line is selected for read, in this embodiment, by placing a voltage on the selected row line, (typically supply voltage "$V_{cc}$," about 5 volts) while maintaining the voltage on all other row lines at ground potential or 0 volts. The column decoder 32, when it is functioning properly, in response to receipt of a column address 38 will select one of the column lines 30a–30y. The column decoder selects a column line by connecting the selected column line to one of a plurality of sense amps 34. The sense amp 34 connected to the column line performs two functions. First, during read it places a voltage (e.g., about 2 volts) on the selected column line. Second, it samples the voltage at the evaluation point after a predetermined period of time to see whether a discharge path from the selected column to ground exists. Thus, considering a particular memory cell 12 if that memory cell is selected for read operation by selecting both the row line 24 and the column line 30 to which it is connected, one of two results can occur, depending upon the state of the floating gate 22 in that particular cell. If the cell is unprogrammed, the cell will have a low threshold and the voltage placed on the row line is sufficient to render the transistor 18 conductive. Because the transistor 18 is turned on there will be a low resistance pathway between the column line and ground 28. As noted above, this result can be detected by the associated sense amp 34 by monitoring the voltage at an evaluation reference point. If, however, the selected cell is programmed, it has a high threshold for turning on and the relatively small voltage (about 5 volts) placed on the row line in 24 is insufficient to turn on the transistor 18. Accordingly, there is no low-resistance pathway between the corresponding column line and ground. As noted above, the sense amp can also detect this condition. After the sense amp detects which of these two conditions exists, it will output, on a data output line 40, a signal which indicates the result. Thus, the output line 40 will carry a first signal if the memory cell 12 at the intersection of the selected row and selected column is programmed and will output a different signal if the selected cell is not programmed.

A memory device including a memory array 41 according to one embodiment of the present invention is depicted in FIG. 2. The device depicted in FIG. 2 has an extra row of cells 42 and an extra column of cells 44.

These cells are "extra" in the sense that they are not used during normal operation of the memory, i.e., the programmed/unprogrammed status of these cells is not determined or output over the data line 40 during normal (i.e., "non-test") operation. During normal operation, the gates of these extra cells in the test row will always be "0" and the test cells in the (N+1)th column do not interfere with the normal operation, since the sense device 58 is not used during normal operation. Therefore, their presence will not interfere with the value of data being read from the selected column and row in normal operation. The select gates of the cells in the extra row 42 are not connected to the row decoder 26. The source and drain of the cells in the extra column 44 are not connected to the column decoder 32 or directly to ground (although they may be selectively connected to ground as described below).

The circuitry of FIG. 2 also includes test logic or parity logic circuitry 46 which, as explained more fully below, outputs signals on an Odd Parity Rows Group Select (OPRGS) line 48, Even Parity Row Group Select (EPRGS) line 50, Odd Parity Column Group Select (OPCGS) line 52 and an Even Parity Column Group Select (EPCGS) line 54. For reasons discussed below, each row of the array is considered as an even parity row or an odd parity row. A row of the array will be considered as an even parity row if the address intended to select that row is an even parity address and a row will be considered an odd parity row if the address intended to select that row is an odd parity address. An address is even parity if the exclusive OR of all bits in the address is "0". An address is odd parity if the exclusive OR of all the bits in the address is "1".

As seen in FIG. 2, the source for the transistors in the extra column 44 are attached to either the OPRGS line 48 or the EPRGS line 50 so as to correspond with the parity of the row to which each test cell is connected. Similarly, the gates in the extra row of cells 42 are connected to either the OPCGS line 52 or the EPCGS line 54 depending upon the parity of the column to which each test cell is connected. The drain for the transistors in the extra column 44 are connected to an extra column line 56 which is input to an extra sense device 58, described more fully below. The extra sense device 58 provides output on an error line 60.

The device depicted in FIG. 2 is preferably packaged with a number of pins for input-output (I/O) and control purposes. The pins 62 include I/O pins such as row address pins and column address pins, data pins, and operational pins such as power supply pins, clock pins, select pins, control pins, and the like. Preferably, the present invention is socket-compatible with previous EPROM devices. However, because additional input signals are needed for conducting the tests, in order to maintain socket-compatibility, several of the input pins 62 are used for more than one function. The multi-functionality of the input pins is, in certain cases, e.g., as described below, achieved by providing input signals on the pins at different voltage levels for different functions and providing a discriminator device 64 which can discriminate among various voltage levels and set the logic levels of output signals to the various destinations depending upon the voltage level of the input signals. The circuitry used for forming a discriminator 64 is well-known in the art and one such discriminator configuration is shown in FIG. 4.

Figure 4:
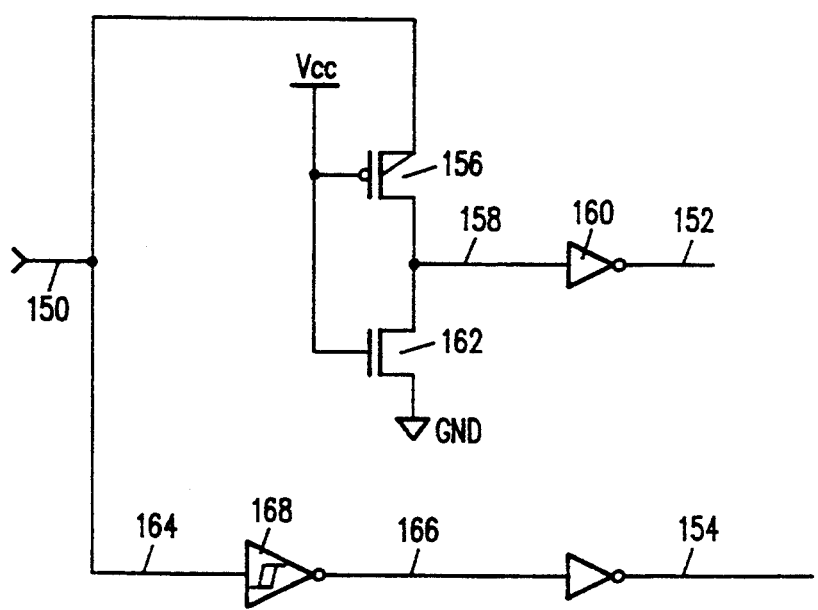
FIG. 4 depicts a discriminator device for differentiating three voltage levels that can appear on an input pin.

In the apparatus shown in FIG. 4, the output on the output lines 152, 154 will depend on the voltage provided at the input 150. The apparatus in FIG. 4 can distinguish among three voltage input levels which will be referred to as "0," "1," and "high voltage." Typically, the voltage of "1" will be equal to $V_{cc}$. The "high voltage" level for testing is typically 8 to 10 volts for $V_{cc}$ of about 5 volts. When the voltage at the input 150 reaches a level sufficiently higher than "1," the P-channel transistor 156 will drive line 158 to a "high" level and thus the output line 152, as a result of the inverter 160, will be "0". Thus, when a "high voltage" is input in the input line 150, the output on line 152 will be a logical "0". If the input voltage level is "0" or "1" the P-channel transistor 156 does not turn on. In this case, the weak N-channel transistor 162, which is always on, will pull down node 158 to ground. At node 164, when the input level is either "1" or "high voltage" the output 166 of the inverter 168 will be "0". When the input level at node 150 is "0" the output at node 166 will be "1".

In one embodiment, the signals from the row address pins, will be sent to the row decoder 26 on line 66 and the signals on the column address pins will be sent to the column decoder 32 on signal line 68. In the preferred embodiment, one of the column address pins is selected for generating the "RowHV" input 70 to the parity logic 46. When this column address pin receives an input signal at "high voltage" level (typically between 8 volts and 10 volts for $V_{cc}$ of about 5 volts), "RowHV" line 70 will become active (level "1"). When this selected column address pin receives "1" (typically VCC) or "0" (typically ground) level input, "RowHV" line 70 will be inactive ("0" level). For the three cases, when the column address pin selected to generate "RowHV" signal, gets an input of "high voltage" level, "1" level, or "0" level, the discriminator circuit 64 will provide column address bit input to the column decoder 32 at "1", "1" and "0" logic level respectively. Similarly, when the row address pin selected to generate "ColHV" signal 72, receives "high voltage" level, "ColHV" signal 72 will become active (level "1"). The three levels of input to this pin will generate the row address bit input to the row decoder 26 in the same manner as described above for column decoder 32.

The TSELECT signal (whose function is described more thoroughly below) can be provided without the necessity of a multi-level input pin. During the column address test described below, a row address pin can be assigned the task of receiving the TSELECT input. Since all the row addresses are deselected during the column address test, it does not matter which row address pin is selected for this task. During the row address test, a column address pin (other than the one used for RowHV signal) can be used for receiving the TSELECT input. As described below, during the row address test, care should be taken to ensure that the address on the column pins should have even parity, which is the internally selected parity in this example. This can be ensured using the rest of the column address pins. The signal level on the pins selected for TSELECT does not have any effect during the normal operation of the chip, during which both RowHV and ColHV are zeros. Any pin which is otherwise unused during the test such as VPP, CE, OE, PGM (when available) can be used for inputting the parity signal 76. Chip enable and output enable functions could be internally activated using RowHv, ColHV during test when needed. The signal level on the pin selected for parity does not have any effect during the normal operation of the chip, during which both RowHV and ColHV are zeros.

Figure 3:
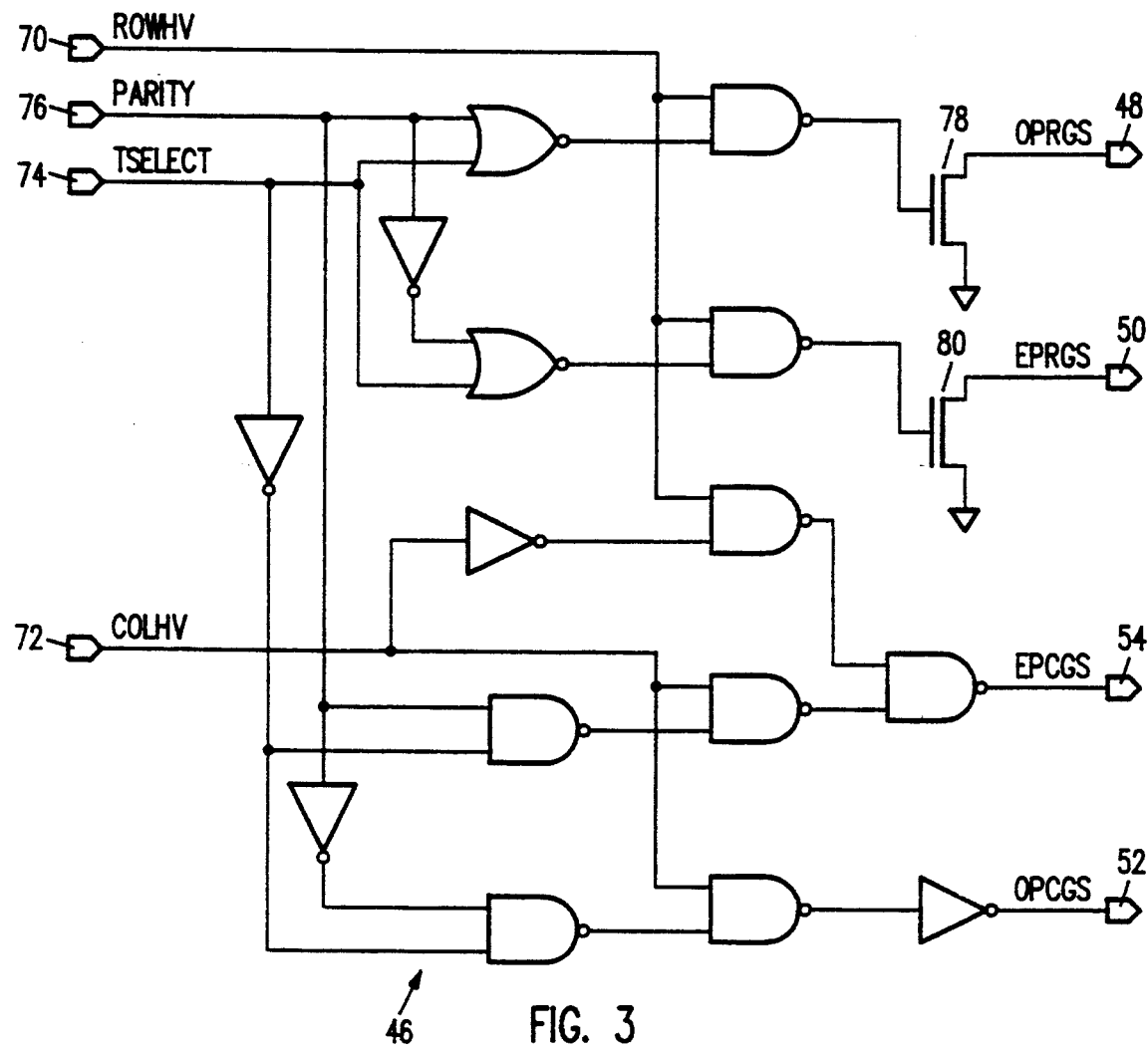
FIG. 3 depicts parity logic circuitry according to one embodiment of the present invention.

As depicted in FIG. 3, the parity logic 46 receives the RowHV 70, ColHV 72, TSELECT 74, and parity 76 inputs and provides output signals on the OPRGS line 48, EPRGS line 50, OPCGS line 52 and EPCGS line 54. Table I is a truth table showing the signal level on the output lines 48–54 for various combinations of input signals 70–76. Not all of the combinations of input signals 70–76 will be used, but Table I has listed all combinations for the sake of completeness. Rows 9, 10, 13, and 14 represent disallowed inputs since RowHV and ColHV should not be simultaneously active high. (The column address test is conducted before or after the row address test). For this reason, the output columns in Table I for these rows is indicated as "Don't Care." Although a particular configuration of gates to achieve the truth table of Table I is depicted in FIG. 3, other gate configurations can also be used for achieving the desired output signals, as is well-known in the art.

In the entries for Table I, conditions in which the OPRGS line 48 and the EPRGS line 50 are "floating" are conditions which duplicate the state of a turned off EPROM cell, as far as the sense amplifier is concerned. For example, suppose that due to an address input error, a wrong parity row line is selected by the row decoder. The test cell in the test column corresponding to the wrongly selected row will be selected. But the node of this wrongly turned on test cell is connected to a floating Row Group Select output from parity logic. This prevents the column line to which the test cell in the test column is connected from being connected to ground. This prevents the sense circuit 58 from wrongly indicating that a test cell of the correct parity group is turned on.

operation, in general, of one type of sense amp and how a sense amp can be modified or used to provide the additional function described above, it will be apparent to those skilled in the art how to use other sense amps to provide the additional function described above.

Figure 5A:
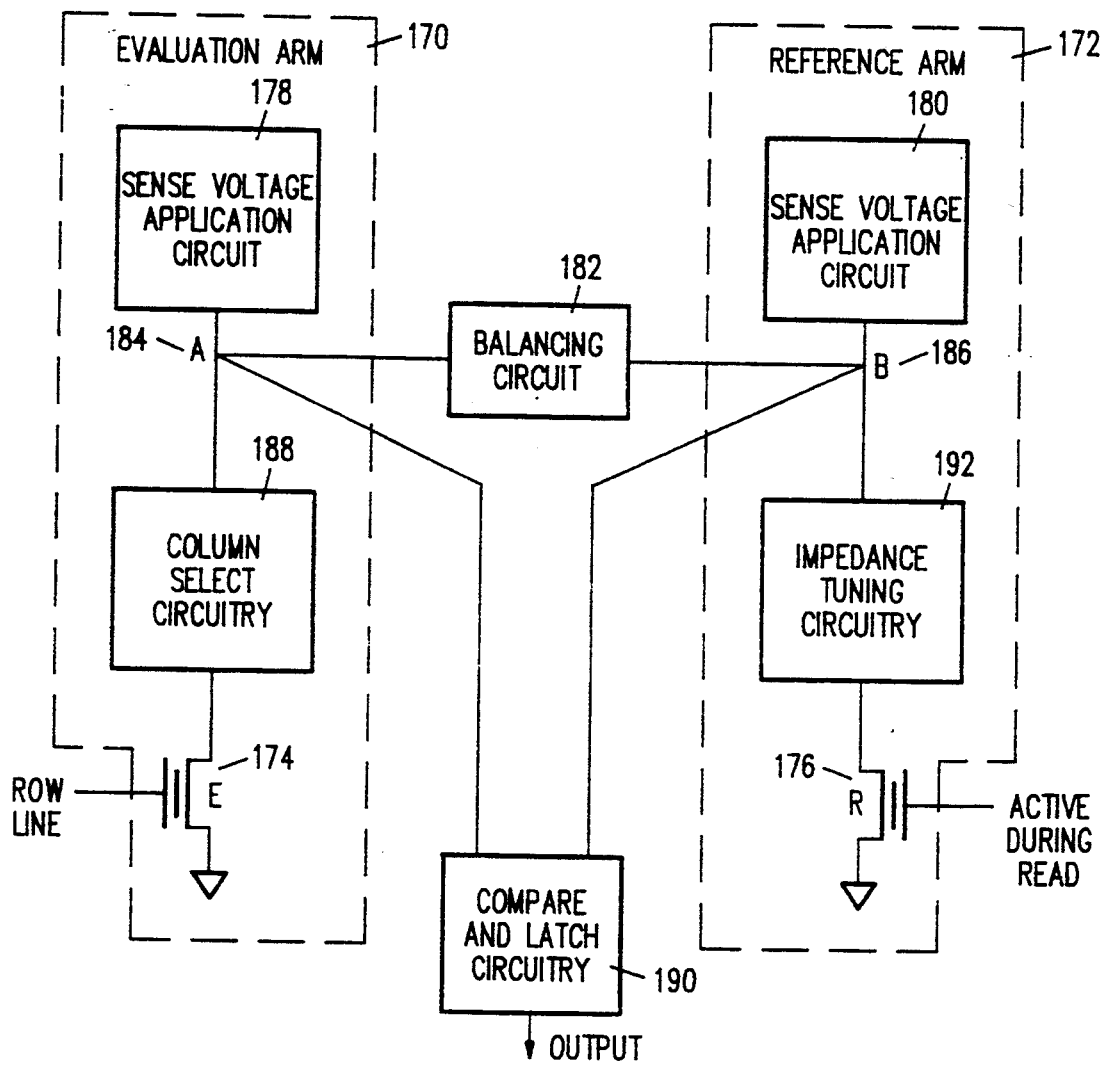
FIG. 5A is a block diagram of a sense amp.

FIG. 5A is a block diagram of a conventional sense amplifier. The sense amplifier of FIG. 5A includes an evaluation arm 170 and a reference arm 172. The EPROM bit E being evaluated is at node 174. Node 176 has a reference EPROM bit R, which is an unprogrammed EPROM bit. For reading the EPROM bit, sense voltage application circuits 178, 180 apply a certain voltage, for example, 2 volts at nodes A 184, and B 186, and balance the voltages at Node A and Node B through the balancing circuitry 182. In the evaluation arm 170, voltage at point A 184 appears on the selected column, through the column select circuitry 188, which is part of or is driven by column decoder block 32. After a certain period of time the balancing circuit 182 disconnects nodes A and B. Then a voltage differential develops between A 184 and B 186, the polarity of which will depend on whether the EPROM bit being evaluated E is programmed or not. Within a certain amount of time after the balancing circuit 182 disconnects nodes A and B, a compare and latch circuit 190 compares the voltages at nodes A and B, and depending on the result, provides an output. The impedance tuning circuitry 192 is adjusted in such a way that, when the EPROM bit being evaluated E is in the unprogrammed state, the voltage at node B 186 will go higher than the voltage at node A 184, when balancing circuit 182 disconnects nodes A and B. If the EPROM bit being evaluated E, is in a programmed state, the voltage at node A 184 will go higher than the voltage at node B 186 after the balancing circuit 182 disconnects nodes A and B.

TABLE I

|   | TSelect 74 | RowHV 70 | ColHV 72 | Parity 76 | OPRGS 48 | EPRGS 50 | OPCGS 52 | EPCGS 54 |
|---|---|---|---|---|---|---|---|---|
| 1 | 0 | 1 | 0 | 1 | 0 | FLOATING | 0 | 1 |
| 2 | 0 | 1 | 0 | 0 | FLOATING | 0 | 0 | 1 |
| 3 | 0 | 0 | 1 | 1 | 0 | 0 | 1 | 0 |
| 4 | 0 | 0 | 1 | 0 | 0 | 0 | 0 | 1 |
| 5 | 1 | 1 | 0 | 1 | 0 | 0 | 0 | 1 |
| 6 | 1 | 1 | 0 | 0 | 0 | 0 | 0 | 1 |
| 7 | 1 | 0 | 1 | 1 | 0 | 0 | 1 | 1 |
| 8 | 1 | 0 | 1 | 0 | 0 | 0 | 1 | 1 |
| 9 | 0 | 1 | 1 | 1 | X | X | X | X |
| 10 | 0 | 1 | 1 | 0 | X | X | X | X |
| 11 | 0 | 0 | 0 | 1 | 0 | 0 | 0 | 0 |
| 12 | 0 | 0 | 0 | 0 | 0 | 0 | 0 | 0 |
| 13 | 1 | 1 | 1 | 1 | X | X | X | X |
| 14 | 1 | 1 | 1 | 0 | X | X | X | X |
| 15 | 1 | 0 | 0 | 1 | 0 | 0 | 0 | 0 |
| 16 | 1 | 0 | 0 | 0 | 0 | 0 | 0 | 0 |

X = DON'T CARE

The sense amps 82 are similar to the sense amps 34 described in connection with the device in FIG. 1, except that the sense amps 82 provide an additional function. The additional function provided by the sense amps 82 is the ability to determine whether more than one of the column lines (including column lines which are not intended to be addressed by the address on the column address pins) have been selected and connected to ground by their respective test cells in the test row turning on.

Figure 5B:
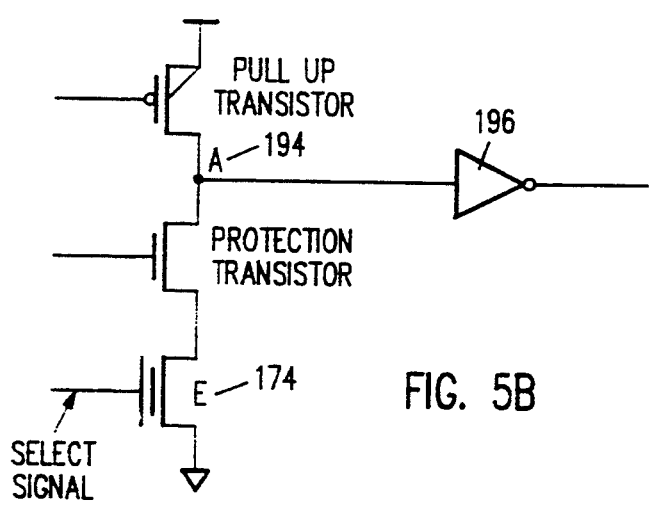
FIG. 5B is a schematic of an alternative sense amp.

To understand the manner in which a sense amp 82 can be provided which performs such additional function, it is useful to briefly describe a typical sense amp. A number of sense amps have been developed and are available as is well-known in the art. By describing the FIG. 5B depicts a circuit for a simpler sense amplifier (which is part of a circuit described in U.S. patent application Ser. No. 07/532,065, corresponding to European patent application Ser. No. 91108014.1, commonly assigned herewith and incorporated by reference to the extent needed to understand the invention). Voltage at node A 194 will be low if the EPROM bit under evaluation E 174 is in an unprogrammed state. Voltage at node A 194 will be $V_{cc}$, if the EPROM bit under evaluation E 174 is in the programmed state. The signal at point A is input to an invertor 196, the crossover point of which is adjusted such that the first signal level will be a logical low or "0" input and the second signal level will be a logical high or "1" input.

With this background, the manner of providing a sense amp 82 which provides the additional function can be described. According to a first embodiment, two different sets of sense amps, similar to those shown in FIG. 5A or those shown in 5B could be used for each bit line. The first sense amp would be a conventional one which would be used for detecting whether at least one cell connected to a selected column line is turned on connecting ground. The second sense amp would be configured to detect whether not more than one EPROM cell in selected column line/s are on, connecting to ground. The second sense amp could be provided with a structure substantially the same as that of the first sense amp but with the reference arm 172 tuned (e.g., by the impedance tuning circuit 192) to detect whether more than one cell connecting to ground is turned on. This type of connection is possible since the rate at which the voltage at the evaluation node decreases is greater when two or more column lines are selected providing parallel paths through the two or more turned-on EPROM cells in the (M+1)th row, connecting the evaluation node to ground, than when a single column line is selected, providing a path between evaluation node and ground through a single turned-on EPROM cell in the (M+1)th row.

A second embodiment would use a single sense amplifier similar to that depicted in FIG. 5A but with two reference arms, one tuned for sensing whether at least one cell connected to the column line is turned on and the other tuned for sensing whether more than one column line is selected providing parallel paths between the evaluation node and ground through more than one turned-on EPROM cell in the test row.

According to a third embodiment, it is possible to construct a sense amp which takes advantage of the fact that tests for logical faults can be conducted at the highest allowed VCC (for example, six volts) and that high speed is not as important in testing for logical faults as it is during normal operation. In this embodiment, a conventional sense amp, such as that shown in FIG. 5A, is used both during normal run time and, during testing, to detect whether at least one cell connected to the column line is turned on. A structure such as that depicted in FIG. 5B can be used to distinguish between the condition of only one EPROM cell turning on and connecting the reference point A 194 to ground, versus the condition of more than one column being selected resulting in turning on of their test cells in the test row connecting the evaluation point A 194 to ground through more than one EPROM cell.

The three above-described embodiments are only examples of sense amps that can be used to provide the additional function and other methods and apparatus to achieve this function will be apparent to those skilled in the art once the present invention is understood.

The extra sense circuit 58 is a circuit for performing three functions. First, the circuit 58 must be capable of selectively providing a voltage, such as about 2 volts on the extra column line 56. Second, the circuit 58 must be capable of determining whether at least one cell in the extra column of cells is turned on, such as by sensing whether the voltage on the extra line 56 is less than the reference voltage after a predetermined time interval. Third, the circuitry 58 must be capable of determining whether more than one cell in the extra column of cells 44 is turned on connecting the column line to a ground potential. This last analysis is, in the preferred embodiment, performed on the basis that the transistors in the extra column 44, even when in the turned-on state, have a certain amount of internal resistance and the potential at the evaluation point of the sense amplifier will be decided by the number of EPROM cells turned on connecting the column line 56 to ground. For this reason, after a voltage has been placed on the extra column line 56, the voltage on the line 56 after a predetermined period will be a first value if a single one of the transistors in the column 44 connects the column line 56 to ground and will have a lower value if two or more transistors in the extra column 44 connect the column line 56 to ground.

The sense amp apparatus which can be used for sense amp 82, described above, can also be used for the extra sense amp 58. However, it is also possible to provide the extra sense amp 58 with a simpler design since, during logical fault detection (the only time during which extra sense amp 58 is used) there is no need to have the complete operational voltage range or to have the speed which is needed for a sense amp during normal operation.

A procedure for using the apparatus depicted in FIGS. 2 through 5 to test a memory will now be discussed. In order to achieve testing, the fabricated memory device, either in wafer form or in packaged form, is connected to a programmable tester. Any standard IC tester can be used for this purpose including those sold by GenRad, Trillium, Q2 and others. Also, programming setups made by companies such as DATAIO can be used for this test. The programmable tester can place the necessary signals onto the input lines, such as the address pins 62 of the device being tested and can receive outputs from the device being tested and can be configured to analyze those outputs to determine whether the response to a given input indicates that there are faults in the device being tested.

Table II (which is a modified version of the fault model given in M. Pawlowski, et. al. "Functional Testing of EPROM's", *IEEE Journal of Solid-State Circuits*, Vol. SC-19, No 2, April 1984, pps. 212–218.) depicts a number of potential faults in a memory device (charge storage related faults not included). The present invention will provide single fault coverage for the types of faults listed in Table II, using the normal test (done in previous OTP EPROMs) for detecting fault types II.1 and II.2. Also, in many cases, the present invention will detect occurrences of multiple faults from same fault type and multiple faults from different fault types. As well known in the art of functional fault analysis (for example, in G. P. Mak, et. al. "The Design of PLAs with Concurrent Error Detection", *Fault Tolerant Computing Symposium* 1982, pps. 303–310) fault analysis has been done by considering that all "stuck-at" faults have a logic level "1" or "0" all open faults such as I.A.4, and I.B.5, are considered to result in a logic level of either "1" or "0" and shorted line faults are assumed to force both the lines to the same logic value, either "0" or "1". The present invention is not used for detection of faults in the memory array which involve charge storage, such as certain instances of unprogrammable cells and loss of charge.

Also shown in Table II is an indication of which faults could be feasibly detected in packaged unprogrammed OTP EPROMs without writing to any EPROM cell. An entry of "yes" in Table II indicates that single fault coverage is possible for this category in previous packaged OTP EPROMs. In many cases the tests on the previous packaged OTP EPROMs will detect the occurrence of multiple faults of this category and will detect this category of faults when this fault occurs in combination with other fault types. An entry "No" indicates that one cannot test the previous new (unprogrammed) packaged OTP EPROMs to ensure that they are completely free of this category of fault, even under single fault conditions, without writing to EPROM cells to test for these fault types. Even if the packaged new (unprogrammed) OTP EPROM contains additional cells put in for test purposes, enabling repeatable tests for packaged new (unprogrammed) OTP EPROMs for address logic faults listed in Table II, if the additional test cells need to be written to at least once, could consume considerably more silicon area adversely affecting the economic feasibility of the design, if it can be done at all.

The present invention allows conducting an Address Logic test and Memory Cell Array test (for certain faults not involving charge storage), without writing to any EPROM cell. Table II gives the fault coverage for previous new (unprogrammed) packaged OTP EPROMs for address logic faults and faults in the memory cell array (not involving charge storage), without writing to any EPROM cell. As discussed above additional coverage can be attained adding additional cells to write to, and adding additional decoding circuit to address those additional cells. For example, for packaged OTP EPROMs by adding two rows of cells which will be written to during the test, at the top of the array in FIG. 1, along with the additional decoding circuit for the added rows, it is possible to ensure faults I.C.1, I.C.2, I.C.3, I.C.4, I.C.5, II.4 and II.7 are detected, using a nonrepeatable test.

Economic architectural implementation of repeatable tests (without programming) for addressing logic (including address inputs) of packaged OTP EPROMs makes this invention well-suited and economically advantageous in a production environment.

TABLE II

| | | | Detectable Without Writing to any EPROM Cell in Packaged Unprogrammed OTP EPROM Without Using the New Methodology |
|---|---|---|---|
| I. | Faults in Addressing Logic: | | |
| | I.A | Faults In Address Input Lines: | |
| | | I.A.1 Input buffer connected to a single address input line is stuck-at-1. | No |
| | | I.A.2 Input buffer connected to a single address input line is stuck-at-0. | No |
| | | I.A.3 Two address input lines are shorted together. | No |
| | | I.A.4 Open address input line. | No |
| | I.B | Row Decoder Failures: | |
| | | I.B.1 Decoder cannot access the addresssed row R(i), instead accesses row R(j). | No |
| | | I.B.2 When row R(i) is addressed row R(i) as well as row R(j) will be accessed. But not vice versa. | No |
| | | I.B.3 When row R(i) is selected row R(j) is selected too, and vice versa. | No |
| | | I.B.4 Row R(j) is permanently selected. | No |
| | | I.B.5 Open row decoder output. | No |
| | I.C | Column Decoder Failures: | |
| | | I.C.1 Decoder cannot access the addressed column C(i), instead accesses C(j). | No |
| | | I.C.2 When column C(i) is addressed, column C(i) as well as column C(j) will be accessed. But not vice versa. | No |
| | | I.C.3 When column C(i) is selected column C(j) is selected too, and vice versa. | No |
| | | I.C.4 Column C(j) is permanently selected. | No |
| | | I.C.5 Open column decoder output. | Yes |
| II. | Faults In the Memory Cell Array: | | |
| | II.1 | Lack of a cell | Yes |
| | II.2 | Unerasable cell (stuck at 0) | Yes |
| | II.3 | Absence of a transistor (stuck at 1) | No |
| | II.4 | Metal to metal short (shorted columns) | No |
| | II.5 | Poly2 to Poly2 short (shorted rows) | No |
| | II.6 | Open Poly2 line (open row line) | No |
| | II.7 | Open metal line (open column line) | Yes |

The testing procedure described below is based on the principle that if the addressing logic (including addressing inputs) are operating correctly each row address input to the device selects one, and only one, row decoder output of the correct parity group, and each column address input into the device will select one, and only one column decoder output of the correct parity group. The three-test procedure described below will detect occurrence of a single fault from Table II. Also, many multiple fault occurrences will be detected by this procedure. A discussion on the relationship between address decoder failures and how it affects decoder output can be found in Cocking, John, Fairchild Systems Technology, "Ram Test Patterns and Test Strategy". Various examples of fault detection described in this paper give the role parity plays in fault detection. According to the methodology described below, the rows and columns are addressed separately in order to check for faults. One embodiment, a memory device is subjected to three types of tests, a row address test, a column address test and a normal test which is a well known test for previous OTP EPROMs. The normal test involves reading ones from EPROM cells at all the address locations. Each of the row address tests and column address tests have two phases, as described below. In general terms, the first phase is intended to determine whether at least one line (a column line or a row line) of the correct parity group is selected and the second phase is intended to determine if more than one column line or more than one row line have been selected.

The "RowHV" input to the parity logic 46 is maintained at logic 1 level during the duration of the row address tests (both phases). Typically, the device being tested will have a chip enable line and a chip output enable line. During the row address test mode, the chip should be enabled (selected) and the chip outputs should be enabled. This can be done internally or externally to the chip, depending on the pin usage. If it is to be done internally the RowHV signal can be used for enabling.

Figure 6:
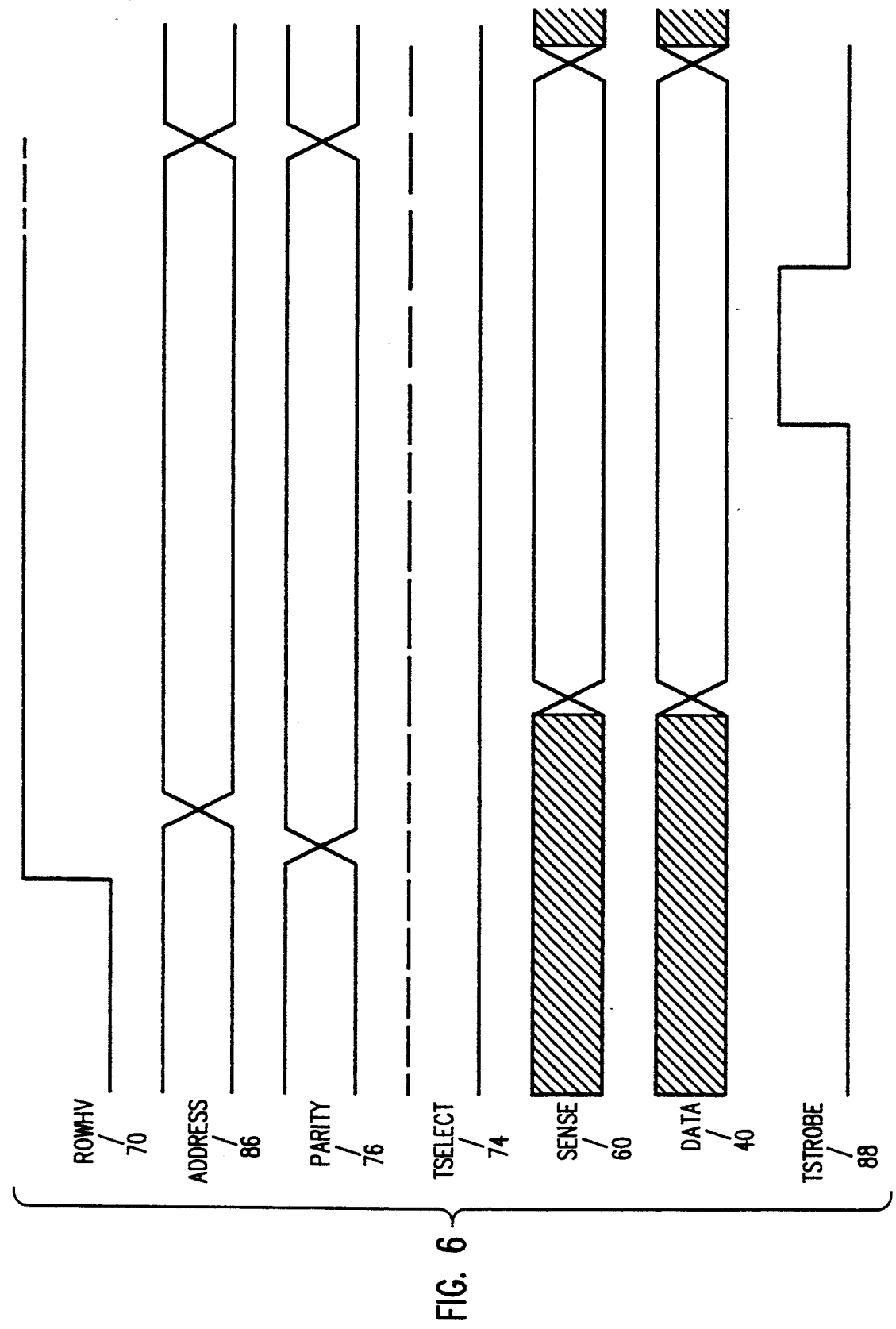
FIG. 6 is a timing diagram showing relative timing of various signals during a row address test.

FIG. 6 is a timing diagram depicting the state of various signals during the first phase of the row address test. As seen in FIG. 6, during row address test, phase I, the TSELECT signal 74 is maintained at the logical low or "0" level. After the RowHV signal 70 is placed in the logical high level (by placing a high voltage on a predetermined column address pin, as described above) the tester places an address on the address pins and a parity, corresponding to the parity of the row portion of the address, on the VPP pin (which as described above is used as the parity pin when in the test mode). The row portion of the address 86 (i.e., the address bits which are placed on the row address pins of the input pins 62) will be an address which, if the device is functioning properly, will result in selection of one of the row lines. This address will have a parity, as described above. The parity, i.e., either odd parity or even parity, will be input by the tester as the parity signal 76.

As noted above, certain of the column address pins are used during the row address test to provide signals such as the RowHV signal 70 and the TSELECT signal 74. However, typically there will be other column address pins which are not used for this purpose. During the column address test, it does not make a difference which address appears on the row address pins, as far as the row decoder is concerned, because all the rows except the test row are deselected during column address tests. This means during the column address test, the row decoder will place zeros on all the row lines in the array, including the row line address which appears on the row address input pins. The decoders will always get the address pin inputs. During the row address test, the column decoder will get the logic levels appearing on the column address input pins. During row address test, the only requirement for the address appearing on the column address input pins, as far as the column decoder is concerned, is that the parity of the column address input needs to be the internally selected parity, e.g., even parity.

During the row address test, preselected column address pins are used for inputting TSELECT and RowHV, as described above. This does not interfere with the ability to apply the column address with the internally selected parity during the row address test. The applied input levels on the rest of the column address pins can be used to ensure that the parity of the column address is the internally selected one.

Since row address pins and column address pins are tested separately, shorts between a row and a column address pin may not be readily detected, unless specific provision is made for that. This type of fault is detected by ensuring that the internally selected parity, is the same as the parity of the applied column address, during the row address test.

Suppose there is a short between a row address input $r(i)$, and a column address input $c(j)$. Suppose during the row address test $c(j)$ has input 0. During the course of the row address test, when $r(i)$ goes to 1, there is a case of a pair of input lines driven to opposite logic levels shorted together. Since both of the shorted address input lines will have the same logic level, the two possibilities are (1) $r(i)=c(j)=0$; (2) $r(i)=c(j)=1$.

In the first case (1), $r(i)$ changes from 1 to 0. This means the address parity of the row selected using the faulty address received by the row decoder, will not be of the same parity input by the tester on the assigned parity input pin. This condition is detected by the sense circuit 58, which will check whether at least one cell of the correct parity group has turned on connecting the column line to ground.

In the second case (2), $c(j)$ changes from 0 to 1. This means, the address parity of the column selected using the faulty address received by the column decoder will not match the internally selected column parity. This will be detected by 82, which checks to see at least one test cell of the correct parity group has turned on connecting selected column to ground.

The use of parity in this test methodology can be used for detecting other types of faults as well. For example, parity may be used to detect shorts between two column address input lines or two row address input lines. For example, assume column line $C(i)$ and $C(j)$ are shorted together. Since they are shorted together they will have the same logic value. Now consider the case when the tester inputs for $C(i)$ and $C(j)$ are 0 and 1, respectively. Tester input to the parity line 76 will be per the tester input values to $C(i)$ and $C(j)$. But internal to the chip, the input to column decoder will have the same logic values (either both 1s or both 0s) for $C(i)$ and $C(j)$. This results in the selected column address line by the decoder having wrong parity. This condition will be detected by sense amp 82. This type of fault testing also applies to other input values and to row pins.

After the address and parity have been input, data will appear on the data output line 40 and the sense output line 60. The output monitoring requirements are summarized in Table III.

TABLE III

| | Row Test Phase I | Row Test Phase II | Column Test Phase I | Column Test Phase II |
|---|---|---|---|---|
| Data | Monitored | — | Monitored | Monitored |
| Sense | Monitored | Monitored | — | — |

During row test Phase I, both the data and sense signals are monitored. The sense line can be monitored on any one of the unused pins using simple logic to gate Sense signal to the pin when RowHV is 1 and TSELECT is 0, if not even an additional phase can be introduced. The output data can be sampled by the tester during T-strobe signal 88 high. T-strobe signal is generated and used by tester internally during the test according to the test program, to decide when the outputs of the device under test needs to be monitored. The output data will be analyzed and/or stored and output by the tester. In order to understand how the output signals determine whether there is a fault in the device 41, it is helpful to describe the response of the device 41 in the case where there is no fault and compare this to the response in a case where there is a fault. The row address test, phase I is intended to determine whether, in response to inputting a row address to the device 41, at least one of the row lines 24a–24r of the correct parity is selected. This determination is made by using extra column 44 of cells. In the preferred embodiment, the row address test is also used to detect shorts between row and column address input lines, as described above. This determination is made by using the extra column 44 and extra row 42 of cells. Each of the cells in the extra column 44, has its top gate connected to one of the row lines 24a–24r. Each cell in the extra column 44 has its drain connected to the extra column line 56. The cells in the extra column 44 which are of even row parity have the source terminal connected to the EPRGS line 50 and those that are of odd row parity have the source terminal connected to the OPRGS line 48. As an illustrative example, suppose that a row address of even parity is input into the device 41. During the row address test, phase I, the TSELECT signal is in the low or "0" state. The "RowHV" signal is in the high or "1" state. The "ColHV" signal is in the low or "0" state and the parity line 76 will be in the low or "0" state indicating even parity. Consulting Table I, it is seen that with these inputs, the output on the EPRGS line 50 will be such that this line connected to a ground level potential while the OPRGS line 48 is floating. If the device 41 is operating properly, the row line 24 corresponding to the input row address will be selected, i.e., will have Vcc voltage placed on it. This will turn on the memory element at the end of that row line (i.e., the element in the extra column 44) thus forming a low resistance pathway between the extra column line 56 and the EPRGS line 50. As noted above, since the input address is even parity, the EPRGS line will be placed at ground potential. Thus, the extra column line 56 is connected to ground via the turned-on state of the test cell in the selected row. Therefore, when the sense circuit 58 detects that the voltage at the evaluation point in the sense amp is dropping, this information indicates that at least one of the row lines 24a–24r was selected in response to input of the row address. Furthermore, it is known that at least one of the row lines which was selected was of the correct parity, i.e., had a parity equal to the parity of the address which was input since only the even row cells have their source connected to ground potential when an even parity address is input.

This situation can be contrasted to a situation in which there is some fault in the device 41 such that input of one of the row addresses does not result in selection of a row line of the proper parity. If no row line is selected, or if only row line having an incorrect parity is selected, then there is no cell in the extra column 44 which will connect the extra column line 56 to ground and accordingly the output 60 will provide information indicating that in response to input of a row address, a row line of the proper parity was not selected. This result can flow from a number of different types of fault. For example, there could be a fault in the line 66, such as an open row address input line, which could result in row decoder 26 seeing a wrong logic level for that address bit input, and there could be a fault in the row decoder 26 which results in a row line of correct parity not being selected. There are also other faults which could cause the described result in the row address test phase I. These are summarized in Table IV.

During phase II of the row address test, the intention is to determine whether, in response to input of a row address, more than one row line 24 is selected. As noted above, the sense circuit 58 can detect this condition by monitoring the voltage drop at its evaluation point. However, in order to test all of the row lines, it will be necessary for OPRGS and EPRGS to be connected to ground potential. As seen from Table I, this is achieved by placing the TSELECT signal 74 in a high or "1" state. In this state, when the RowHV signal is high and the ColHV signal is low, both the OPRGS line 48 and the EPRGS line 50 will be connected to ground potential. Accordingly, the procedure for row address test phase II and the timing diagram for row address test phase II is the same as described above and as depicted in FIG. 6 except that the TSELECT signal is in a high or "1" state rather than a low state. The types of faults, as listed in Table II, which are detected by row address test, phase II, are summarized in Table IV.

TABLE IV

| Summary of Testing Procedure | |
|---|---|
| Test | Faults Detected |
| Row Address Test, Phase I | IB1 |
| Row Address Test, Phase II | IB2, IB3, IB4 |
| Column Address Test, Phase I | IC1 |
| Column Address Test, Phase II | IC2, IC3, IC4, II3, II4 |
| Row and Column Address Test, Phase I | IA1, IA2, IA3, IA4 |
| Column Address Test, Phase I & II | IC5, II7 |
| Row Address Test, Phase I & II | IB5, II5, II6 |
| Normal Test | IB5, II1, II2, II5, II6, II7, IC5 |

With regard to the "Faults Detected" entries for "normal test" in Table IV, IB5 will be detected if the open row line is at logic "0". II5 will be detected if both the shorted rows are at logic "0" when either one of the shorted rows is selected. II6 will be detected if the open segment of the row line is at logic value "0". However, these faults will have proper single fault coverage using Row Address Test Phases I&II.

Preferably, the row address test will be repeated with addresses which are intended to select each of the rows 24a–24r in order to fully test the row address capability of the device 41.

Figure 7:
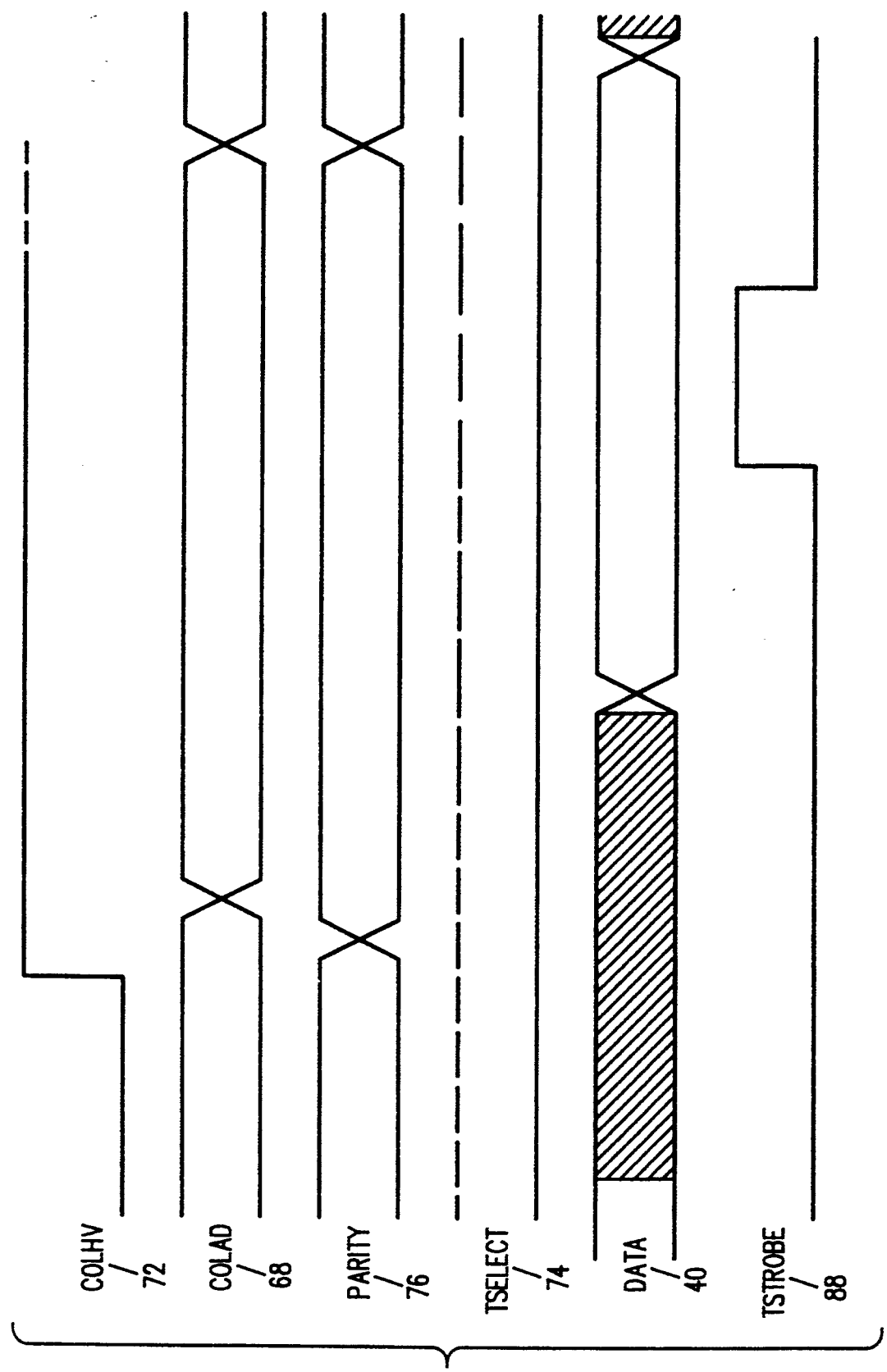
FIG. 7 is a timing diagram showing relative timing of various signals during a column address test.

FIG. 7 depicts a timing diagram for phase I of the column address test. During the column address test, the chip should be enabled (selected) and the chip outputs should be enabled. This can be done internally or externally to the chip, depending on the pin usage. If it is to be done internally, the ColHV signal can be used for enabling. During the column address check, all of the row lines 24 are to be deselected. The ColHV signal 72 is placed at the high or "1" level (by placing a high voltage level on a predetermined 1 of the row address pins, as described above). During phase I of the column address test, the TSELECT signal 74 is held at the low or "0" level. A predetermined one of the row address pins can be used for the TSELECT signal during the column address test. Column addresses 68 are input such as by placing them on input pins 62. A parity signal which indicates a parity equal to the parity of the column address is provided on parity line 76. The data 40 is then sampled during the T-Strobe signal 88 in a manner similar to that described above in connection with FIG. 6.

During phase I of the column address test, each column selected in response to the input column address is connected to a test cell in the test row, the gate of which is connected to either Odd Parity Columns Group Select (OPCGS) line 52 or Even Parity Columns Group Select (EPCGS) line 54. If there is no fault in the device 41, the test cell, to the drain of which the selected column line is connected, will be in the turned on condition. For example, as shown in Table I, when the parity input line 76 receives a "0" or low input during phase I of the column address test, the EPCGS line 54 will be maintained at a high level, while OPCGS line 52 will be maintained at low level. The opposite configuration occurs when the parity line 76 is in the high or "1" level during the column address test phase I. Thus, the column address parity input on line 76 determines which line (OPCGS line 52 or EPCGS line 54) is kept at high level during phase I of the column address test. In a fault-free device 41, this results in the test cell connected to the selected column, being in a turned on condition.

During the column address test, all the rows except the test row are deselected. Also, the selected cell in the test row 42 will be in the turned on condition, as described above. Because of this, in a fault free device 41, of the column selected from 30a-30y, none of the cells in that column, with the exception of the cell in the extra row 42, will be in a turned on condition. This results in the selected column being connected to ground through the test cell. Thus, the voltage at the evaluation point of the sense amp connected to the selected column line is being pulled down. As noted above, the sense amp 82 is able to determine whether at least one of the column lines has been connected to the ground through an EPROM cell in the turned on condition. Moreover, if such a state of affairs is detected, it is also known that at least a column line which was selected was a column line of correct parity, since only these column lines are connected to an extra row cell which has its gate held at a high level. On the other hand, if an error in, for example, the column address input line 68 results in wrong parity column being selected, or an error on the decoder 32 results in the selection of no column line in response to input of a column address, this state of affairs is detected by the sense amp 82, indicating that there is an error in the device 41. The types of faults which are detected by the column address test phase I are summarized in Table IV.

Next, in column address test phase II, it is intended to determine whether more than one column address line selected and connected to ground through turned on EPROM test cells by monitoring the voltage at the evaluation point. In order to perform this test for all column lines, both the EPCGS line 54 and the OPCGS line 52 must be maintained at the high or "1" level. As seen from Table I, this is achieved by placing the TSELECT line 74 in the high or "1" level. Thus, the procedure for column address test phase II and the timing diagram for column address test phase II are identical to that described above and depicted in FIG. 7, except that the TSELECT signal is maintained at the high level rather than at the low level.

Following the row address test and the column address test, the above-described normal test, which is a well known currently used test in previous OTP EPROMs, is performed. During the normal test (as during normal operation of the device 41) the parity logic 46 does not change values on the output lines 48-54. Instead, the EPCGS and OPCGS lines 54, 52 will be held at the low or "0" level so that the cells in the extra row 42 will be turned off. In the example implementation of parity logic shown in FIG. 3, during normal operation and normal test the EPRGS and OPRGS lines 50, 48 will be held in the "0" or low state. This implementation will result in the test cell in the (N+1)th column being turned on when a row is selected. The state of the cells in the N+1th column do not interfere with the normal operation or normal test, since during that time output of sense circuit 58 is not used. During the normal test, addresses are provided on the pins 62 preferably so as to address each of these cells in the memory 41. The output line 40 is sampled to determine whether the output is as expected. If this does not occur when the cell is addressed, memory device is considered to have a fault. Table IV summarizes the types of faults which can be found by the normal test.

In light of the above description, a number of advantages of the present invention can be seen. The present invention permits testing address input, address logic, and memory array (for certain faults not involving charge storage), of memory such as EPROM without the requirement that a cell be written or programmed. Of course, one could, if desired, program a cell, such as one of the cells in the normal portion of the array, during testing. However, at least some faults detection of which, in previous devices, required writing or programming a cell at least a first time, can be performed in the present invention without such a writing or programming. Since use of this new methodology does not require writing to a cell, it is also not necessary to erase such a programmed or written cell before programming or before repeating the testing of a tested device. This is particularly useful in connection with packaged OTP or windowless EPROMs since erasure is infeasible with such devices. Furthermore, since erasure often requires a substantial amount of time, the present invention permits testing the addressing logic without the expenditure of time required for such erasure. Since the addressing logic (including addressing inputs) test can be performed without writing to any of the test cells (which should be in the unprogrammed state) and independent of the program content of the main array, the addressing logic test can be repeated, without a need for intervening erasure, unlike addressing logic tests which requires a write every time. This invention provides a cost efficient design and methodology which permits repeatable testing of new (unprogrammed) packaged OTP EPROMs for faults in address logic including address inputs (given in Table II), without writing to any cell even a first time, which could not be done in previous new (unprogrammed) packaged OTP EPROMs. This is important because of the fact that packaged OTP EPROMs cannot be erased after writing. During the manufacturing of OTP EPROMs, even in the unpackaged state, erasure is a time consuming process, and introduces additional steps and thereby delay during a test. This invention provides a writeless address logic test with time complexity O(SQRT(N)). Because only a single additional row and a single additional column are provided and because the parity logic 46 and additional area for sense amp circuitry 82, 58 are of minimal size, the present invention permits a writeless addressing logic test in OTP EPROMs with very little increase in die size. The present invention provides a device which can be socket compatible with previous memory devices. Because the testing of the addressing logic is independent of the memory content, testing of these items can be conducted without knowledge of the program stored in the main portion of the array. This aspect is particularly useful when the programming stored in the main portion of the array is of confidential or sensitive nature, and is prevented from reading in microcontrollers with embedded EPROM with the programmable security option.

A number of variations and modifications of the described apparatus and method can also be used. It is possible to use certain aspects of the present invention without using other aspects. For instance, it is possible to perform only one phase of the row address test without performing the other or to perform the column address test without performing the row address test. The tests can be performed in a different order than that described. As will be apparent to those skilled in the art, circuitry other than that depicted can be used to achieve the functionality described. For example, parity logic to obtain the functionality given in Table I can be implemented with a different combination of logic gates other than the combination depicted in FIG. 3. The parity logic truth table itself can be implemented differently, for example, allowing row group select lines OPRGS and EPRGS to float during normal operation. Apparatus and methods could be devised to test for some faults, but not others (e.g., to test for faults whose probability of occurrence is high enough to justify the testing effort and cost). The testing part of the scheme could be used in devices other than OTP EPROMs. The described apparatus and method could be used in connection with windowed EPROMs, for example, in order to avoid the need for lengthy erasing after a test procedure. Although it is believed there is no current economic need for the invention in contexts other than those described above, at least some aspects of the invention could theoretically be applied with some variations and modifications to other types of memories such as static RAM and EEPROMs and possibly to other types of array devices containing addressable elements.

Although the invention has been described by way of a preferred embodiment and certain variations and modifications, other variations and modifications can also be used, the invention being defined by the following claims.

What is claimed is:

1. In a memory device having a main array of programmable memory cells which can be in either a turned on or a turned off state connected by row lines or column lines or both, at least some of said memory cells in said main array being addressable by addresses received on a plurality of input pins, said memory device including a decoder for decoding at least a portion of said addresses received on said plurality of input pins and for selecting at least one of said row or column lines in response to receiving one of said plurality of addresses, apparatus for testing said memory device, comprising:

a plurality of test memory cells distinct from said memory cells in said main array, each of said test memory cells being coupled to one of a plurality of lines, said plurality of lines being either a plurality of said row lines or a plurality of said column lines, wherein each of said test memory cells can be placed in a conducting state; and means for detecting whether exactly one of said row or column lines is individually selected in response to at least a portion of a first of said plurality of addresses by detecting whether exactly one of said plurality of test memory cells is in said turned-on state, and for detecting whether a second of said row or column lines is individually selected in response to at least a portion of a second of said plurality of addresses, by detecting whether exactly one of said plurality of test memory cells is in said turned on state without the necessity for programming any of said plurality of test memory cells.

2. Apparatus, as claimed in claim 1, wherein said means for detecting comprises means for placing one of said plurality of memory cells in a turned-on state, different from the state of the remainder of said plurality of memory cells, when said one memory cell is connected to one of said plurality of lines which is selected by said means for decoding.

3. Apparatus, as claimed in claim 1, wherein said means for detecting includes means for detecting whether more than one of said plurality of lines is selected in response to at least a portion of one of said plurality of addresses.

4. Apparatus for testing a memory device which includes an M by N memory array having M rows and N columns of memory cells which are addressable during normal operation of said memory array by a row address and a column address received on address pins, and which are connected by a plurality of selectable row lines and column lines, the apparatus comprising:

an (N+1)th column of memory cells, each of which can be in a turned-on state or a turned-off state, each memory cell in said (N+1)th column being connected to a row line of said memory array, wherein each memory cell in said (N+1)th column can be in said turned-on state only if the row line to which it is connected is a selected row line;

a first sensing circuit connected to said (N+1)th column of memory cells which outputs a first signal only if exactly one of said memory cells in said (N+1)th column is in said turned-on state;

an (M+1)th row of memory cells, each of which can be in a turned-on state or a turned-off state, each memory cell in said (M+1)th row being connected to a column line of said memory array, wherein each memory cell in said (M+1)th row can be in said turned-on state only if the column line to which it is connected is a selected column line;

a second sensing circuit connected to said memory cells in said (M+1)th row which outputs a second signal only if exactly one of said memory cells in said (M+1)th row is in said turned-on state.

5. Apparatus, as claimed in claim 4, wherein each of said memory cells in said (N+1)th column is either one of a first plurality of cells or one of a second plurality of cells, each of said first plurality of cells being coupled to an odd-addressed row line, each of said second plurality of cells being coupled to an even-addressed row line and wherein each of said memory cells in said (M+1)th row is either one of a third plurality of cells or one of a fourth plurality of cells, each of said third plurality of cells being coupled to an odd-addressed column line, each of said fourth plurality of cells being coupled to an even-addressed column line and further comprising;

a first row group select line connected to said first plurality of cells in said (N+1)th column, and a second row group select line connected to said second plurality of cells in said (N+1)th column, wherein each of said first row group select line and said second row group select line can be placed in a first line state, allowing a cell connected thereto to be placed in said turned-on state when the row line to which it is connected is a selected row line, and a second line state, preventing a cell connected thereto from being placed in said turned-on state; and a first column group select line connected to said third plurality of cells in said (M+1)th row and a second column group select line connected to said fourth plurality of cells in said (M+1)th row, wherein each of said first column group select line and said second column group select line can be placed in a first line state, allowing a cell connected thereto to be placed in said turned-on state when the column line to which it is connected is a selected column line, and a second line state, preventing a cell connected thereto from being placed in said turned-on state.

6. Apparatus, as claimed in claim 5, further comprising:

circuitry which places said second column group select line in said first line state and said first column group select line in said second line state during a first test phase, when an even parity column address is applied to said address pins, which places said first column group select line in said first line state and said second column group select line in said second line state during said first test phase, when an odd parity column address is applied to said address pins, and which places both said first column group select line and said second column group select line in said first line state during a second test phase; and circuitry which places said second row group select line in said first line state and said first row group select line in said second line state during a third test phase, when an even parity row address is applied to said address pins, which places said first row group select line in said first line state and said second row group select line in said second line state during said third test phase when an odd parity row address is applied to said address pins, and which places both said first row group select line and said second row group select line in said first line state during a fourth test phase.

7. Apparatus, as claimed in claim 4, having a plurality of input pins for receiving input signals, including said address pins, and wherein at least one pin is connected to a means for discriminating between a first signal and a second signal, said first signal for use at least during said normal operation of said memory array and said second signal for use during at least a first test phase of said memory.

8. Apparatus, as claimed in claim 7, wherein said means for discriminating discriminates on the basis of the voltage levels of said first and second signals.

9. Apparatus, as claimed in claim 4, wherein at least one of said first sensing circuit and said second sensing circuit includes circuitry for detecting if more than one memory cell is in said turned-on state.

10. Apparatus, as claimed in claim 9, further comprising a sense line connected to said memory cells in said (N+1)th column and wherein said first sensing circuit includes circuitry for detecting that more than one memory cell is in said turned-on state by detecting whether a voltage on said sense line is less than a reference voltage source.

11. Apparatus, as claimed in claim 4, wherein said memory device is a windowless programmable read only memory.

12. Apparatus, as claimed in claim 4, wherein said memory device is a one-time programmable erasable read only memory.

13. Apparatus, as claimed in claim 4, wherein said output of said first sensing circuit is unaffected by a change in the state of cells in said M by N memory array during normal operation.

14. A method for testing a memory device which includes a memory array having M rows and N columns of memory cells which are addressable during normal operation of said memory by a row address placed on a plurality of row address pins and a column address placed on a plurality of column address pins, the method comprising:

providing the memory device in a configuration wherein each said row address and each said column address can be an even parity address or an odd parity address, each memory cell being connected to one of a plurality of selectable row lines and one of a plurality of selectable column lines, a first plurality of said row lines being selectable in response to said odd parity row addresses, a second plurality of said row lines being selectable in response to said even parity row addresses, a first plurality of said column lines being selectable in response to said odd parity column addresses, a second plurality of said column lines being selectable in response to said even parity column addresses, providing an (M+1)th row of memory cells, each of which is connected to one of said column lines which can be placed in a turned-on state only when the column line to which it is connected is selected, and an (N+1)th column of memory cells, each of which is connected to one of said row lines and which can be placed in a turned-on state only when the row line to which it is connected is selected:

placing a first row address on said plurality of row address pins;

determining whether exactly one of said memory cells in said (N+1)th column of memory cells is in said first state;

placing first a column address on said plurality of column address pins;

determining whether exactly one of said memory cells in said (M+1)th row of memory cells is in said first state.

15. A method, as claimed in claim 14, further comprising:

preventing all memory cells in said (N+1)th column which are connected to a row line which is configured to be selectable by an address with a parity which is different from the parity of said first row address, from being placed in said turned-on state, during a first time period; and determining if at least one of said memory cells in said (N+1)th column is in said turned-on state.

16. A method as claimed in claim 14, further comprising:

permitting all memory cells in said (N+1)th column which are connected to a selected row line to enter said turned-on state.

17. A method as claimed in claim 14, further comprising:

determining if more than one of said memory cells in said (N+1)th column is in said turned-on state.

18. A method, as claimed in claim 14, further comprising:

preventing all memory cells in said (M+1)th row which are connected to a column line which is configured to be selectable by an address with a parity which is different from the parity of said first column address, from being placed in said first state; and determining if at least one of said memory cells in said (M+1)th row is in said turned-on state.

19. A method, as claimed in claim 14, wherein said steps of determining whether exactly one of said memory cells in said (N+1)th column of memory cells is in said turned-on state and determining whether exactly one of said memory cells in said (M+1)th row of memory cells is in said turned-on state are performed in the absence of writing to any cell in said (N+1)th column of memory cells or said (M+1)th row of memory cells.

20. A method, as claimed in claim 14, further comprising:

placing a second row address on said plurality of row address pins;

determining whether exactly one of said memory cells in said (N+1)th column of memory cells is in said turned-on state after placing said second row address on said plurality of row address pins;

placing a second column address on said plurality of column address pins;

determining whether exactly one of said memory cells in said (M+1)th row of memory cells is in said turned-on state after placing said second column address on said plurality of column address pins.

21. A method, as claimed in claim 14, further comprising:

repeating the testing of said memory device by repeating said step of placing a row address on said plurality of row address pins and thereafter repeating said step of determining whether exactly one of said memory cells in said (N+1)th column of memory cells is in said turned-on state.

22. A method for testing addressing logic of an EPROM device which includes a first plurality of memory cells, said first plurality of memory cells being coupled to a plurality of row lines and a plurality of column lines, said first plurality of memory cells being addressable during normal operation of the device using addresses received on the address pins and having at least one address decoder, the method comprising:

providing a plurality of test memory cells, distinct from said first plurality of memory cells, said plurality of test memory cells including a column of test memory cells coupled to said plurality of row lines and a row of test memory cells, coupled to said plurality of column lines, wherein each of said plurality of test memory cells can be placed in a conducting state;

placing address data on at least some of the said address pins of said EPROM;

conducting a repeatable test of said address decoder for said plurality of memory cells by reading at least one of said plurality of test memory cells and without having to write to any memory cell and without reading any cell from said plurality of memory cells.

23. A method for testing an EPROM having a memory device which includes a main array used during normal operation, and comprising a first plurality of memory cells and at least one decoder, and having a plurality of address pins, said first plurality of memory cells being coupled to a plurality of row lines and a plurality of column lines, said first plurality of memory cells is being said EPROM having means for reading at least one of said memory cells, the method comprising:

providing a plurality of test memory cells, distinct from said first plurality of memory cells, wherein each of said plurality of test memory cells can be placed in a conducting state, said plurality of test memory cells including a column of test memory cells coupled to said plurality of row lines and a row of test memory cells, coupled to said plurality of column lines;

placing address data on at least some of said address pins of said EPROM;

testing said decoder a first time and then repeating testing to determine if the decoder responds properly to input of data by reading the contents of at least one of said plurality of test memory cells without writing to any memory cell and without reading any cell in said main array, regardless of the state of the cells in said main array.

24. Apparatus for testing addressing logic of an M by N memory array having M rows and N columns of memory cells which are addressable during normal operation of said memory array by a row address and a column address received on address pins, and which are connected by a plurality of selectable row lines and column lines, the apparatus comprising:

an (N+1)th column of memory cells, each of which can be in a turned-on state or a turned-off state, each memory cell in said (N+1)th column being connected to a row line of said memory array, wherein each memory cell in said (N+1)th column can be in said turned-on state only if the row line to which it is connected is a selected row line;

a first sensing circuit connected to said (N+1)th column of memory cells which outputs a first signal if at least one of said memory cells in said (N+1)th column is in said turned-on state and outputs a second signal, different from said first signal, if no more than one of said memory cells in said (N+1)th column is in said turned on state;

an (M+1)th row of memory cells, each of which can be in a turned-on state or a turned-off state, each memory cell in said (M+1)th row being connected to a column line of said memory array, wherein each memory cell in said (M+1)th row can be in said turned-on state only if the column line to which it is connected is a selected column line;

a second sensing circuit connected to said memory cells in said (M+1)th row which outputs a third signal if at least one of said memory cells in said (M+1)th row is in said turned-on state, and outputs a fourth signal, different from said third signal, if no more than one of said memory cells in said (M+1)th row is in said turned on state.

* * * * *